(12) United States Patent
Furusawa et al.

(10) Patent No.: US 7,198,821 B2
(45) Date of Patent: Apr. 3, 2007

(54) METHOD OF MANUFACTURING A DEVICE, DEVICE, AND ELECTRONIC APPARATUS

(75) Inventors: Masahiro Furusawa, Chino (JP); Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 262 days.

(21) Appl. No.: 10/410,146

(22) Filed: Apr. 10, 2003

(65) Prior Publication Data

US 2004/0081768 A1 Apr. 29, 2004

(30) Foreign Application Priority Data

Apr. 19, 2002 (JP) ............................. 2002-118286
Mar. 31, 2003 (JP) ............................. 2003-096516

(51) Int. Cl.
*B05D 1/26* (2006.01)
*B05D 5/06* (2006.01)

(52) U.S. Cl. ..................... 427/256; 427/98.4; 427/162; 427/466

(58) Field of Classification Search .................. 427/96, 427/98.4, 117, 160–169, 466, 467, 256, 286
See application file for complete search history.

(56) References Cited

U.S. PATENT DOCUMENTS 4,891,242 A * 1/1990 Ito et al. .................... 427/98.5
5,132,248 A * 7/1992 Drummond et al. ........ 505/325
2001/0028916 A1 * 10/2001 Akahira ......................... 427/8
2002/0071018 A1 * 6/2002 Tachikawa et al. ......... 347/106

FOREIGN PATENT DOCUMENTS

| EP | 0 754 553 B1 | 5/2004 |
|---|---|---|
| JP | A-06-344627 | 12/1994 |
| JP | A-08-271724 | 10/1996 |
| JP | A-09-138306 | 5/1997 |
| JP | A 9-300664 | 11/1997 |
| JP | 2001-286813 | 10/2001 |
| JP | 2003-324266 | 11/2003 |

* cited by examiner

*Primary Examiner*—Fred J. Parker
(74) *Attorney, Agent, or Firm*—Oliff & Berridge, PLC

(57) ABSTRACT

In this method of manufacturing a device, when discharging the liquid drops upon the substrate, a bit map made up from a plurality of pixels against which liquid drops are discharged is established upon the substrate. When establishing the pixels, when the interval of the discharge nozzles of the liquid drop discharge head 1 is taken as "a", and the size in the Y axis direction of the pixels is taken as $b_y$, the pixels are established so that the condition $b_y = a/n$ is satisfied, where n is a positive integer.

7 Claims, 21 Drawing Sheets

METHOD OF MANUFACTURING A DEVICE, DEVICE, AND ELECTRONIC APPARATUS

BACKGROUND OF THE INVENTION

1. Field of the Invention

The present invention relates to a method of manufacturing a device, in which the device is manufactured by discharging material in liquid form against a substrate from a liquid drop discharge head.

2. Background Art

In the past, a color filter has been used for a liquid crystal display device. The color filter is made as one unit with the liquid crystal display device, and is endowed with the functions of enhancing the picture quality and of imparting to each picture element a hue of a respective primary color. As methods for manufacturing this type of color filter, there are known a method (a dyeing method) of forming a pattern by hardening illuminated portions by illuminating light via a photo-mask onto a painted on layer of photosensitive resin, and thereafter removing the portions of the painted on layer which have not been irradiated by light so as to perform a development process, and then dyeing it; or a photolithographic method of manufacturing the color filter by using in series compounds in which red colored, green colored, and blue colored dyes are dispersed in a photosensitive resin and, in the same manner as above, forming a painted on layer, illuminating it with light, and performing development processing. These methods invite deterioration of the workability and increase of the manufacturing cost, since various processes such as a film formation process, a photolithographic process, a development process, and the like are required.

On the other hand, as a method of manufacturing a color filter, there is a method of forming the color filter layer of a color filter by using a liquid drop discharge head. With this method it is possible to reduce the manufacturing cost, since it is easy to control the positions in which are discharged the liquid drops of the material in liquid form (ink) which includes the material for formation of the color filter layer, and also the wastage of the material is low.

With a liquid drop discharge head, it is desirable from the point of view of manufacturability to utilize a multi nozzle head which is equipped with a plurality of discharge nozzles which discharge liquid drops. However, the picture element pitch (the pattern pitch) of the color filter and the nozzle interval "a" of the liquid drop discharge head will not necessarily agree with one another. Due to this, in order to make the nozzle interval and the pattern pitch agree with one another, a technique has been disclosed in Japanese Patent Laying Open Publication Heisei 9-300664 for performing scanning while tilting the liquid drop discharge head by just a predetermined angle $\theta$ with respect to the direction which is orthogonal to the scanning direction (hereinafter, appropriately, this will be termed the "non-scanning direction").

Furthermore, with regard to the patterns for forming by liquid drop discharge, it is unusual for them to be used independently by themselves; it often happens that they realize their function in combination with other thin film patterns which are formed before or after them by photolithography or the like. In this sort of case, independently of whether or not the patterning accuracy due to photolithography is comparatively better than the patterning accuracy obtained due to liquid drop discharge, up till now, during the design of a pattern to be formed by photolithography, the nozzle pitch of the discharge device has been accorded no consideration whatsoever. Due to this problems occur as described previously, and things such as scanning while tilting the head have been performed, and due to this it has not been possible to perform discharge of a pattern at good efficency, even when using a head equipped with a plurality of nozzles.

However, problems arise with the above described background technique, as will be described below.

Although with the above described publicly disclosed technique it is possible to make the pattern pitch by in the non-scanning direction and the nozzle pitch in the non-scanning direction agree with one another, there are problems with making pattern pitch $b_x$ in the scanning direction and the nozzle pitch in the scanning direction agree with one another. This is because, although the pattern pitch $b_y$ in the non-scanning direction and $a \cdot \cos \theta$ which is the nozzle pitch in the non-scanning direction have an integer ratio to one another, the pattern pitch $b_x$ in the scanning direction and $a \cdot \sin \theta$ which is the nozzle pitch in the scanning direction do not, realistically, have an integer ratio to one another.

On the other hand although, even when the liquid drop discharge head is tilted, it becomes possible to discharge the liquid drops in the predetermined positions in the scanning direction by adjusting the respective timings at which the liquid drops are discharged from each of the discharge nozzles, there is a requirement to make the control interval for discharge operation of the discharge nozzles in the scanning direction very fine, and this invites decrease of the scanning speed and complication of the control, and the manufacturability is deteriorated.

When manufacturing a color filter using the liquid drop discharge head, even if, by providing banks upon the surface which receives the discharge, it is arranged that the liquid drops are discharged in the desired discharge positions with only small deviations, the liquid drops are forced into the desired positions by the operation of the banks. However, since it only happens infrequently that banks are used when forming a wiring pattern using a liquid drop discharge head, for example, if it is attempted to form a wiring pattern of straight line form in the non-scanning direction, there is a requirement to make the control interval for discharge operation in the scanning direction very fine, as described above, and this invites deterioration of manufacturability.

SUMMARY OF THE INVENTION

The present invention has been conceived in consideration of this type of circumstance, and its objective is to provide a method of manufacturing a device, which can discharge the liquid drops in the desired positions when forming a predetermined pattern upon a substrate using a multi nozzle head, thus being able to form a pattern with good accuracy In order to solve the above described problems, the method of manufacturing a device of the present invention comprises a process of making a film in a predetermined pattern upon a substrate by shifting a liquid drop discharge head and said substrate relatively in a predetermined direction, and discharging a material in liquid form against said substrate from a plurality of discharge nozzles which are formed in said liquid drop discharge head and which are arranged at predetermined intervals in the direction orthogonal to said predetermined direction, comprising: a process of setting upon said substrate a plurality of unit regions in the form of a lattice against which liquid drops of said material in liquid form are discharged; and a process of forming said pattern by discharging said liquid drops from said discharge nozzles against predetermined unit regions among said plurality of unit regions; wherein said unit regions are set so that, when the interval of said discharge nozzles of said liquid drop discharge head is termed a, and the size of said unit regions in the direction orthogonal to said predetermined direction is termed $b_y$, the condition $b_y=a/n$ (where n is a positive integer) is satisfied.

According to the present invention, a plurality of unit regions in the form of a lattice against which the liquid drops are to be discharged, in other words a bitmap, are established in advance upon the substrate, and the liquid drops are discharged against the unit regions of this bitmap. When establishing the bitmap, by setting the size $b_y$ of the unit regions (or of the pixels) in the direction orthogonal to the predetermined direction (the non-scanning direction) and the interval a of the discharge nozzles of the liquid drop discharge head so that they have an integer ratio to one another, it is possible to make the discharge nozzles and the unit regions agree with one another, even without tilting the liquid drop discharge head as in the prior art. Accordingly, it is possible to discharge the liquid drops in the desired discharge positions without it being necessary to perform any complicated control in relation to the discharge operation. To put it in another way, by setting the bit map, in other words the pattern design rule, according to the interval a of the discharge nozzles, it is possible to make the discharge nozzles and the unit regions agree with one another, and to perform the discharge operation without reducing the scanning speed.

With the method of manufacturing a device of the present invention, it is also acceptable for said unit regions to be set so that, when the size of said unit regions in said predetermined direction is termed $b_{x1}$, the condition $b_{x1}=a/n$ (where n is a positive integer) is satisfied.

Furthermore, with the method of manufacturing a device of the present invention, it is also acceptable for said unit regions to be set so that, when the size of said unit regions in said predetermined direction is termed $b_{x1}$, the condition $b_{x1}=b_y=a/n$ (where n is a positive integer) is satisfied. In this case, the unit region is set to square, and it is possible to perform pattern design easily.

With the method of manufacturing a device of the present invention, it is also acceptable, during said discharge while performing said relative shifting, for said liquid drops to be discharged in said predetermined direction so that the liquid drops disposed upon said substrate do not mutually overlap, or so that an overlap of less than or equal to 10% of the diameter of the liquid drops when they are disposed upon said substrate is generated. In this case, it is possible to prevent excess provision of the material in liquid form upon the substrate in the scanning direction, and it is possible to prevent the occurrence of bulges.

It is also acceptable to form a continuous pattern by discharging the liquid drops in a single scanning episode so that they do not overlap, or so as to generate an overlap of less than or equal to 10% of their diameter, and by performing this a plurality of times. With the method of manufacturing a device of the present invention, it is also acceptable to perform said discharge during said relative shifting, and to perform said discharge after having relatively step shifted said liquid drop discharge head and said substrate by just a positive integer multiple of the size $b_y$ in the direction orthogonal to said predetermined direction. In this case, after the liquid drop discharge head has completed a single episode of scanning, it is possible to make the discharge nozzles and the unit regions agree with one another by step shifting it in the non-scanning direction by just $b_y$ (=a/n).

With the method of manufacturing a device of the present invention, it is also acceptable, after said step shift has been performed, during said discharge, for said liquid drops to be discharged in the direction orthogonal to said predetermined direction so that the liquid drops disposed upon said substrate do not mutually overlap, or so that an overlap of less than or equal to 10% of the diameter of the liquid drops when they are disposed upon said substrate is generated. In this case, it is possible to prevent excess provision of the material in liquid form upon the substrate in the non-scanning direction, and it is possible to prevent the occurrence of bulges.

The method of manufacturing a device of the present invention comprises a process of making a film in a predetermined pattern upon a substrate by shifting a liquid drop discharge head and said substrate relatively in a predetermined direction, and discharging a material in liquid form against said substrate from a plurality of discharge nozzles which are formed in said liquid drop discharge head and which are arranged in a row or rows in the direction orthogonal to said predetermined direction, comprising: a process of setting upon said substrate a plurality of unit regions in the form of a lattice against which liquid drops of said material in liquid form are discharged; and a process of forming said pattern by discharging said liquid drops from said discharge nozzles against predetermined unit regions among said plurality of unit regions; wherein, when: the specified value for said direction orthogonal to said predetermined direction which is specified in advance is termed $b_{ky}$, the interval of said discharge nozzles of said liquid drop discharge head is termed a, the size of said unit regions in the direction orthogonal to said predetermined direction is termed $b_{y2}$, the size of said unit regions in said predetermined direction is termed $b_{x2}$, and said relative shifting said liquid drop discharge head slopes at an angle θ with respect to said direction orthogonal to said predetermined direction, said unit regions are set so that the conditions $b_{y2}=b_{ky}/n$ (where n is a positive integer), and $b_{x2}=(a \cdot \sin θ)/m$ (where m is a positive integer) are satisfied.

According to the present invention, some type of restriction occurs in a process including, for example, before or after the liquid drop discharge process, and, even if the case occurs that if the size of a unit region in the direction orthogonal to the predetermined direction (the non-scanning direction) is not set according to the interval of the discharge nozzles, it is possible to make the discharge nozzles and the unit regions agree with one another by, along with tilting the liquid drop discharge head at just the angle θ, also making the size of the unit regions in the scanning direction and in the non-scanning direction be respectively the above described $b_{y2}$ and $b_{x2}$ respectively.

With the method of manufacturing a device of the present invention, it is also acceptable for the interval a of said discharge nozzles or 1/n-th thereof (where n is an integer greater than or equal to 2) to be taken as a basic unit, and to perform design of a pattern other than the pattern formed by said discharge.

Furthermore, with the method of manufacturing a device of the present invention, it is also acceptable, in performing design of a pattern other than the pattern formed by said discharge, to perform the design based upon said unit regions which have been set.

In this case, by taking the discharge nozzle interval (or 1/n-th thereof) as the basic unit, the design of a pattern which is formed by some method other than the liquid drop discharge method, for example by a photolithographic method, comes to be able to be performed. If this type of thing is done, when performing liquid drop discharge while making the position agree with a pattern which is determined in advance and is formed by a method other than the liquid drop discharge method, or which is formed by a subsequent process, it is possible to perform discharge while agreeing entirely with its pattern, even if the head is not tilted.

The device of the present invention is manufactured by the above described method of manufacturing a device. In this case, a device is provided which has a pattern which is formed at high accuracy.

The electronic apparatus of the present invention includes a device as described above. In this case, an electronic apparatus equipped with a high performance device is provided.

Here, the liquid drop discharge head of the present invention includes a liquid drop discharge head provided to a liquid drop discharge device. The liquid drop discharge head is a device which is capable of discharging the material in liquid form in fixed amounts by the liquid drop method; for example, it is a device which is capable of doling out the material in liquid form (as a fluid) intermittently in fixed amounts of for example 1 to 300 nanograms.

By utilizing the liquid drop discharge method as a method of manufacturing a device, it is possible to form a reflective film in a predetermined pattern with cheap equipment.

As the method for liquid drop discharge, a piezo-jet method in which the liquid material (material in liquid form) is caused to be discharged by changing the volume of a piezoelectric element, or a method in which the material in liquid form is caused to be discharged by generating steam abruptly by the application of heat, would be acceptable. Here, by a material in liquid form is meant a medium having viscosity which can be discharged (can be dripped) from discharge nozzles of a liquid drop discharge head. It may be water based or oil based. Provided that it includes enough of the material in liquid form (viscous) which can be discharged from the nozzles or the like, it will be acceptable even if solid state material is mixed in, provided that as a whole it is liquid. Furthermore, the material which is included in the material in liquid form, apart from being one which is dispersed as minute particles in the solvent, may even be one which has been dissolved by heating to above its melting point, or may be one to which some functional material other than a solvent, such as dye or pigment, has been added. Furthermore, other than being a flat substrate, the substrate may be a substrate of curved form. Yet further, it is not necessary for the pattern formation surface to be a hard one; apart from glass, plastic, and metal, a surface endowed with flexibility such as film, paper, rubber or the like will be acceptable.

The device of the present invention includes an element and a device having a predetermined wiring pattern, or a color filter or the like.

BRIEF DESCRIPTION OF THE DRAWINGS

FIG. 12A is a figure showing an example of a portable telephone; FIG. 12B is a figure showing an example of a portable type information processing device; and FIG. 12C is a figure showing an example of a wristwatch type electronic apparatus.

THE PREFERRED EMBODIMENTS

In the following, the method of manufacturing a device according to the present invention will be explained with reference to the drawings.

Figure 1:
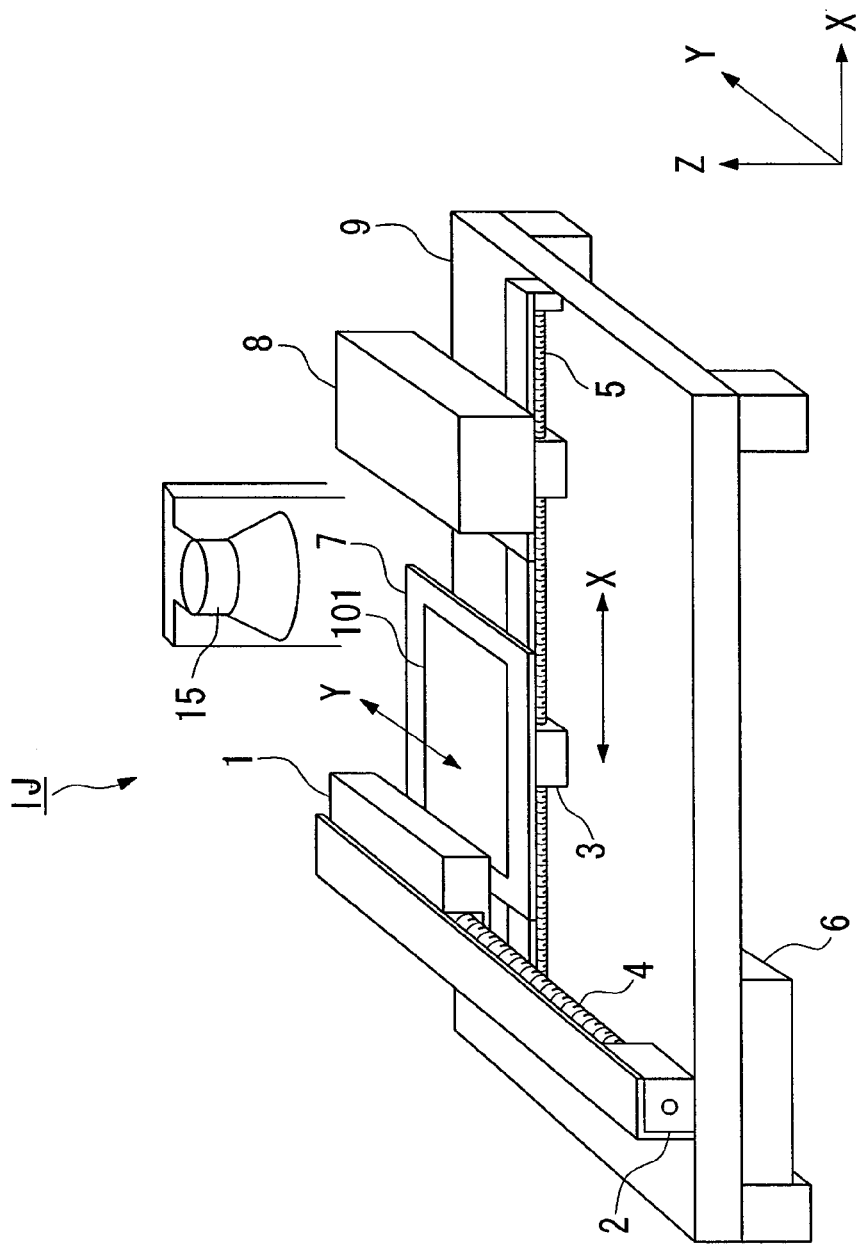
FIG. 1 is a schematic perspective figure showing a liquid drop discharge device which is used in the method of manufacturing a device of the present invention.

FIG. 1 is a schematic external perspective view of a liquid drop discharge device which is comprised in a liquid drop discharge head which is used in the method of manufacturing a device according to the present invention.

Referring to FIG. 1, the liquid drop discharge device IJ comprises a liquid drop discharge head 1, an X-axis direction drive shaft 4, a Y-axis direction guide shaft 5, a control device 6, a stage 7, a cleaning mechanism 8, a base 9, and a heater 15.

The stage 7 is an element for supporting a substrate 101 upon which a material in liquid form is to be provided by this liquid drop discharge device IJ, and it is provided with a fixing mechanism not shown in the figures which fixes the substrate 101 in a standard position.

The liquid drop discharge head 1 is a liquid drop discharge head of a multi nozzle type which comprises a plurality of discharge nozzles, and its lengthwise direction and the Y-axis direction are coincident. The plurality of discharge nozzles are provided upon the lower surface of the liquid drop discharge head 1 and are arranged in rows along the Y-axis direction at fixed intervals. Material in liquid form including, for example, minute electrically conductive particles is discharged from the discharge nozzles of the liquid drop discharge head 1 against the substrate 101 which is supported upon the stage 7.

Figure 2:
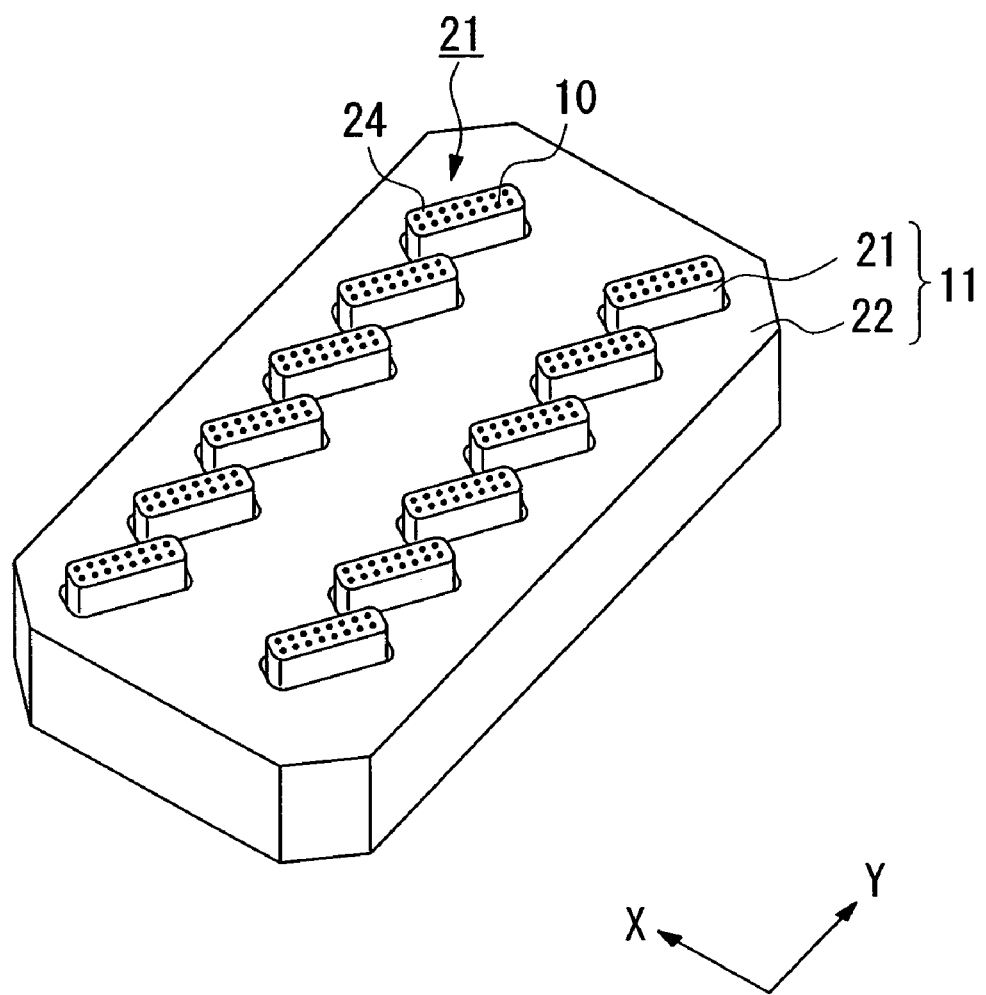
FIG. 2 is a schematic exterior view of a liquid drop discharge head.

FIG. 2 is a figure showing the liquid drop discharge head 1 as seen from the nozzle surface side (the side which opposes the substrate 101). As shown in FIG. 2, the liquid drop discharge head 1 comprises a plurality of head portions 21 and a carriage portion 22 which carries these head portions 21. A plurality of discharge nozzles 10 are provided upon the nozzle surfaces 24 of the head portions 21 and discharge liquid drops of material in liquid form. Each of the head portions 21 (the nozzle surfaces 24) is formed as a plane rectangle; and, upon each of the nozzle surfaces 24, the plurality of discharge nozzles 10 are provided as arranged in two rows spaced apart approximately along the X axis direction of the head portion 21 which is its widthwise direction, and, in the rows, at fixed intervals approximately along the Y axis direction of the head portions 21 which is its lengthwise direction (for example, one row may include 180 nozzles, with a total of 360 nozzles). Furthermore the plurality of head portions 21 (in FIG. 2, six in one row, and a total of 12), along with confronting the discharge nozzles 10 towards the substrate 101, also are supported upon the carriage portion 22 in row form along approximately the Y axis direction in the state of being inclined at predetermined angles with respect to the Y axis, and moreover in the state of being arranged in two rows between which a predetermined interval is opened up along the X axis direction, so that their positions are fixed.

Here, the liquid drop discharge head 1 comprises a mechanism (not shown in the figures) which is capable of adjusting the fixing angle of this liquid drop discharge head 1 in the Y axis direction. The angle θ of the liquid drop discharge head 1 with respect to the Y axis direction can be varied by this angle adjustment mechanism. By driving the angle adjustment mechanism, it is possible to arrange the lining up of each of the discharge nozzles 10 along the Y axis direction, and to adjust the angle with respect to the Y axis of the direction in which the discharge nozzles are lined up.

Returning to FIG. 1, a drive motor 2 is connected to the X axis direction drive shaft 4. The X axis direction drive motor 2 is a stepping motor or the like, and, when a drive signal for the X axis direction is supplied from a control device 6, the X axis direction drive shaft 4 is rotated. When the X axis direction drive shaft 4 rotates, the liquid drop discharge head 1 shifts along the X axis direction.

The Y axis direction guide shaft 5 is fixed to the base 9 so as not to move. The stage 7 comprises a Y axis direction drive motor 3. The Y axis direction drive motor 3 is a stepping motor or the like, and, when a drive signal for the Y axis direction is supplied from the control device 6, it shifts the stage 7 in the Y axis direction.

The control device 6 supplies voltage for discharge control of the liquid drops to the liquid drop discharge head 1. Furthermore, it supplies a drive pulse signal which controls the shifting in the X axis direction of the liquid drop discharge head 1 to the X axis direction discharge motor 2, and a drive pulse signal which controls the shifting of the stage 7 in the Y axis direction to the Y axis direction drive motor 3.

The cleaning mechanism 8 is for cleaning the liquid drop discharge head 1. A drive motor in the Y axis direction not shown in the figure is provided to the cleaning mechanism 8. The cleaning mechanism is shifted along the Y axis direction guide shaft 5 by driving this Y axis direction drive motor. The shifting of the cleaning mechanism 8 is also controlled by the control device 6.

The heater 15 is here, a means for heat processing the substrate 101 by lamp annealing, and it performs evaporation and drying of the solvent which is included in the material in liquid form which has been applied upon the substrate 101. The turning on and turning off of the power source for this heater 15 is controlled by the control device 6. In this embodiment, the liquid drop discharge device IJ forms a wiring pattern upon the substrate 101. Accordingly, minute electrically conductive particles (minute metallic particles), which are the material for forming the wiring pattern, are included in the material in liquid form. The material in liquid form is a substance in which the minute metallic particles are made into a paste using a predetermined solvent and a binder resin. For the minute metallic particles, for example, gold, silver, copper, iron or the like are suggested. It is desirable for the particle diameter of the minute metallic particles to be from 5 to 100 nm. The material in liquid form which has been discharged upon the substrate 101 from the liquid drop discharge head 1 is converted into an electroconductive film (film manufacture) by being heat processed by the heater 15.

Furthermore, as the material in liquid form for forming the wiring pattern, there may be used a material in liquid form which includes an organic metallic compound, an organic metallic complex, and a substance similar thereto. As the organic metallic compound, for example, an organic silver compound is suggested, and it is possible to use a solution of the organic silver compound dispersed (dissolved) in a predetermined solvent as the material in liquid form for forming the wiring pattern. In this case diethylene glycol diethyl ether may, for example, be used as the solvent. If an organic silver compound (an organic metal compound) is used as the material in liquid form, then, by heat processing or light processing the material in liquid form, the organic portion is eliminated, and the silver particles (the metallic particles) remain and exhibit electroconductivity.

The liquid drop discharge device IJ discharges liquid drops against the substrate 101 while scanning the liquid drop discharge head and the stage 7 which supports the substrate 101 relatively to one another. Here, in the following explanation, the X axis direction will be taken as the scanning direction (the predetermined direction), and the Y axis direction which is orthogonal to the X axis direction will be taken as the non-scanning direction. Accordingly, the discharge nozzles of the liquid drop discharge head 1 are provided in rows at fixed intervals in the Y axis direction which is the non-scanning direction.

Next, the method of manufacturing a device by discharging liquid drops against the substrate 101 using the above described liquid drop discharge head 1 will be explained while referring to FIG. 3 through FIG. 7.

The method of manufacturing of this embodiment comprises a process of establishing upon the substrate 101 a bitmap in the form of a lattice which is made up from a plurality of pixels (unit regions) which are regions against which liquid drops are to be discharged, and a process of discharging liquid drops against predetermined pixels among the bitmap.

Figure 3:
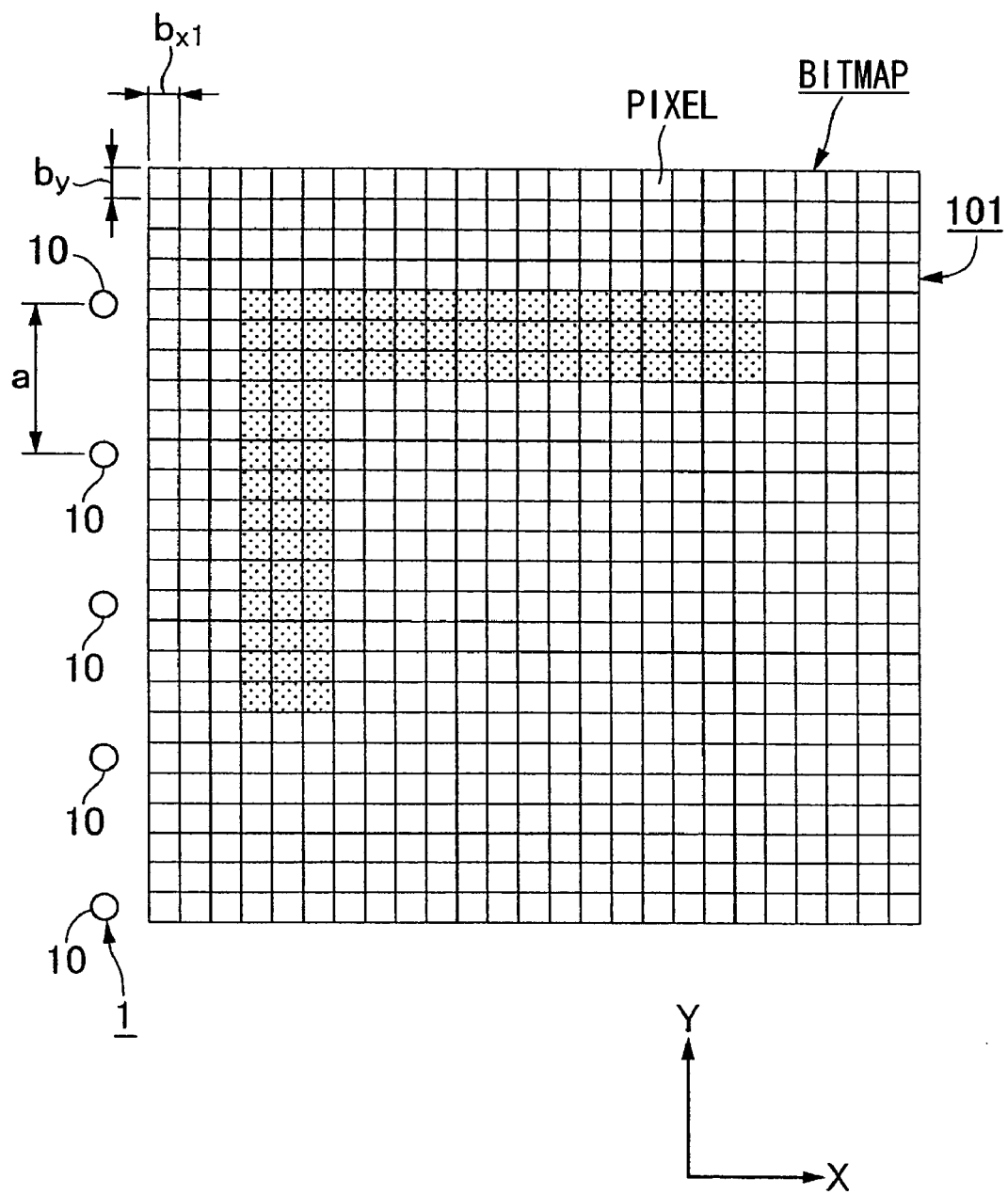
FIG. 3 is a figure for explaining the method of manufacturing a device of the present invention, and is a figure showing an interval between discharge nozzles and a unit region.

FIG. 3 is a figure schematically showing the plurality of discharge nozzles 10 which are provided to the liquid drop discharge head 1, and the bitmap which is established upon the substrate 101.

As shown in FIG. 3, a single pixel is set as square. In other words, for a single pixel, its size $b_{x1}$ along the X axis direction (the scanning direction) and its size $b_y$ along the Y axis direction (the non-scanning direction) are set to be the same.

The lengthwise direction of the liquid drop discharge head 1 is made to agree with the Y axis direction. Furthermore, the discharge nozzles 10 are provided on the liquid drop discharge head 1 at a fixed interval "a" in the Y axis direction. Each of the plurality of discharge nozzles 10 is arranged in a row along the Y axis direction.

In this embodiment, the size $b_y$ of the pixels in the Y axis direction is set to be finer than the interval a between each of the discharge nozzles 10. And, when establishing the bitmap, the size of a single pixel in the Y axis direction is set so that:

$b_y = a/n$ (where $n$ is a positive integer)

In FIG. 3 there is shown an example in which n has been set to =5.

Furthermore, in this embodiment, since a single pixel is set to be square, the size of a single pixel in the X axis direction is set so that:

$b_{x1} = a/n$ (where $n$ is a positive integer)

Figure 4:
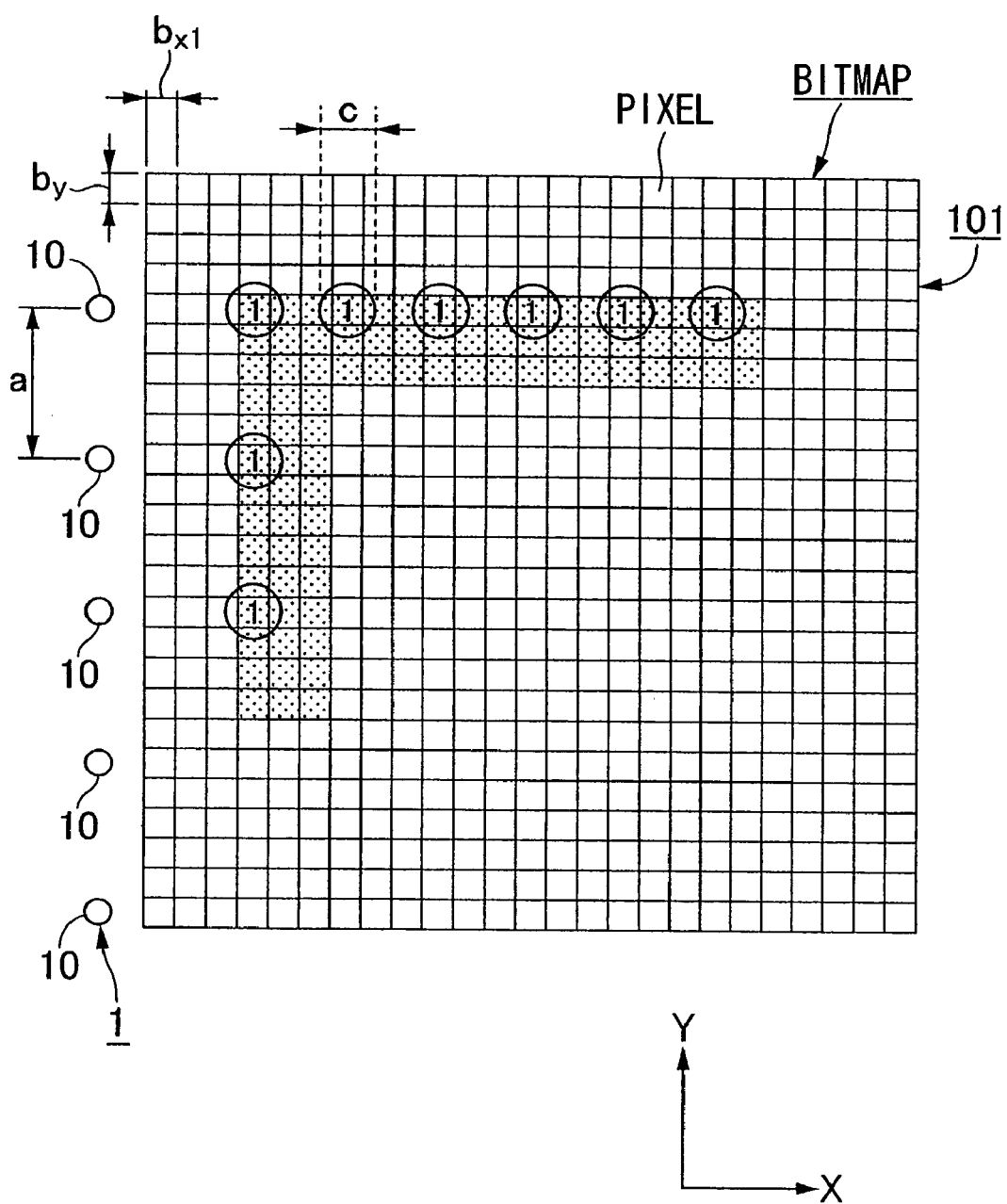
FIG. 4 is an explanatory view of the method of manufacturing a device of the present invention.

FIG. 4 is a typical view when discharging the liquid drops against the substrate 101 by a single episode of scanning using the discharge nozzles 10. It should be understood that, in FIG. 4, "1" is appended to the liquid drops which have been discharged by the first scanning episode.

And, in the following explanation using FIG. 4 through FIG. 7, it is supposed that, finally, liquid drops are to be discharged against each of the pixels of the regions shown by grey in FIG. 3.

When discharging liquid drops against the substrate 101 while scanning the liquid drop discharge head 1 in the X axis direction, the liquid drop discharge head 1 discharges the liquid drops while keeping them apart by predetermined intervals between them in the X axis direction, based upon control by the control device 6. In this embodiment, as shown in FIG. 4, the liquid drops are discharged against the predetermined pixels while keeping them apart in the X axis direction by twice the pixel interval.

On the other hand, by impacting against the substrate 101, the liquid drops which have been discharged against the substrate 101 wet and spread out upon the substrate 101. In other words, as shown by the circles in FIG. 4, the liquid drops which have impacted against the substrate 101 wet and spread out so as to have a diameter c which is greater than the size of a single pixel.

Thus it is ensured that the liquid drops which have been distributed upon the substrate 101 do not overlap one another, since they are discharged with the predetermined interval (two pixels' worth) being opened between them in the X axis direction. By doing this, it is possible to prevent provision in excess of the material in liquid form upon the substrate 101 in the X axis direction, and it is possible to avoid the occurrence of bulges. It should be understood that although, in FIG. 4, the liquid drops are not arranged to overlap one another when they have been disposed upon the substrate 101, it would also be acceptable to dispose the liquid drops so that they overlapped one another to a certain extent. For example, although in FIG. 4 the liquid drops are discharged while opening them apart by two pixels' worth in the X axis direction, it would also be acceptable for the liquid drops to be discharged while opening them apart by a single pixel's worth.

In this case, in a single scanning episode, it would be possible to prevent the occurrence of bulges by discharging the liquid drops so as to generate an overlap of 10% or less of the diameter c of the liquid drops when they have been disposed upon the substrate 101.

Here, the manner of wetting and spreading out when the liquid drops have been disposed upon the substrate 101, in other words, the diameter c of the liquid drops upon the substrate 101, changes according to the characteristics of the material in liquid form. Accordingly, an interval of disposition of the liquid drops (a pixel interval) upon the substrate 101 during a single scanning episode is obtained in advance experimentally in order to arrange that the liquid drops do not overlap one another when they have been disposed upon the substrate 101, or in order to generate an overlap of 10% or less of the diameter c of the liquid drops, and the discharge operation in a single scanning episode is performed based upon this pixel interval which has been obtained.

Figure 5:
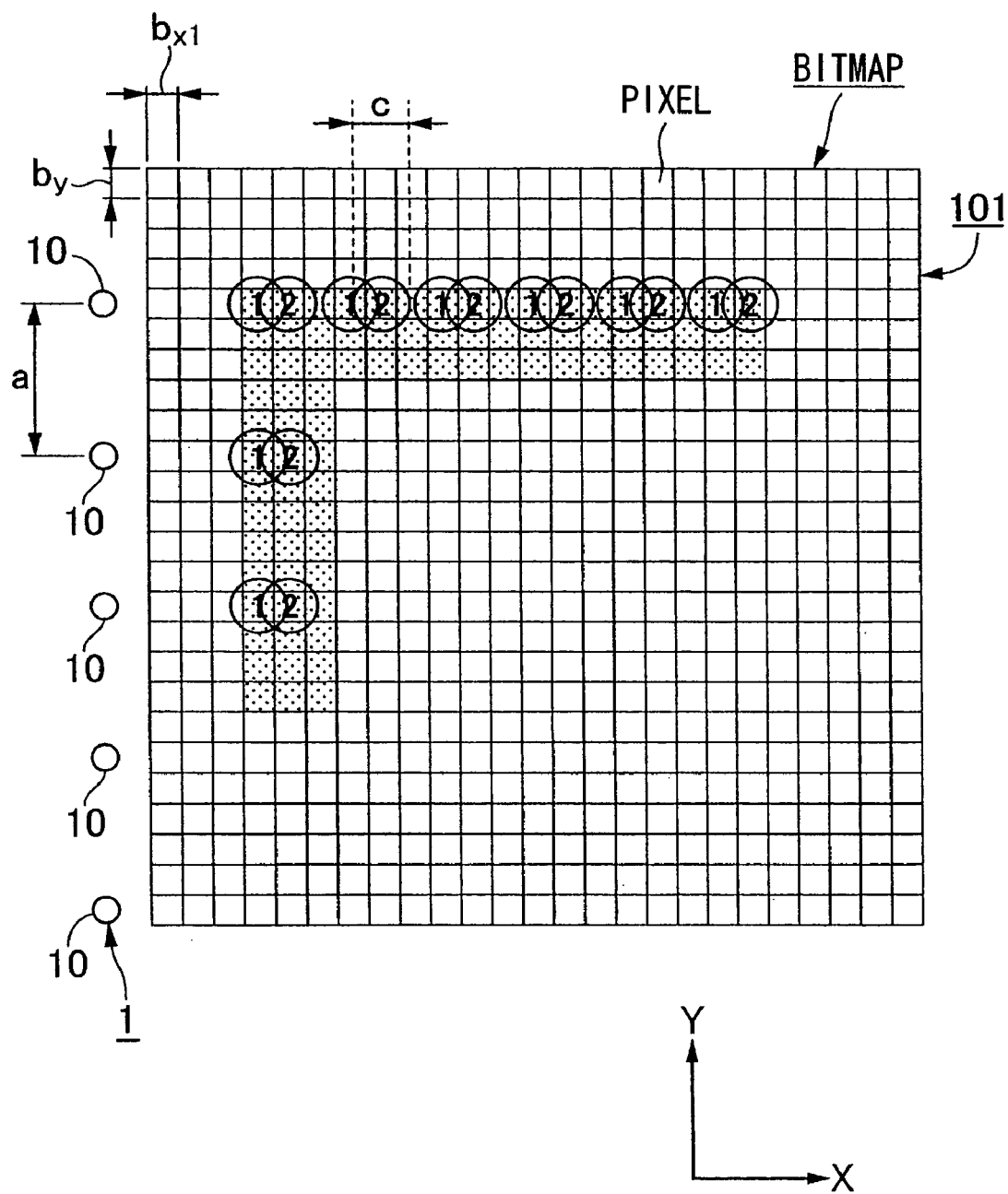
FIG. 5 is an explanatory view of the method of manufacturing a device of the present invention.

FIG. 5 is a typical view when the liquid drops have been discharged upon the substrate 101 from the discharge nozzles 10 by a second episode of scanning. It should be understood that, in FIG. 5, "2" is appended to the liquid drops which have been discharged by the second scanning episode. During the second scanning episode as well, the discharge operation is performed while opening up two pixels' worth in the X axis direction. Furthermore, during the second scanning episode, the liquid drops which have impacted also wet and spread out upon the substrate 101 so as to have the diameter c.

Figure 6:
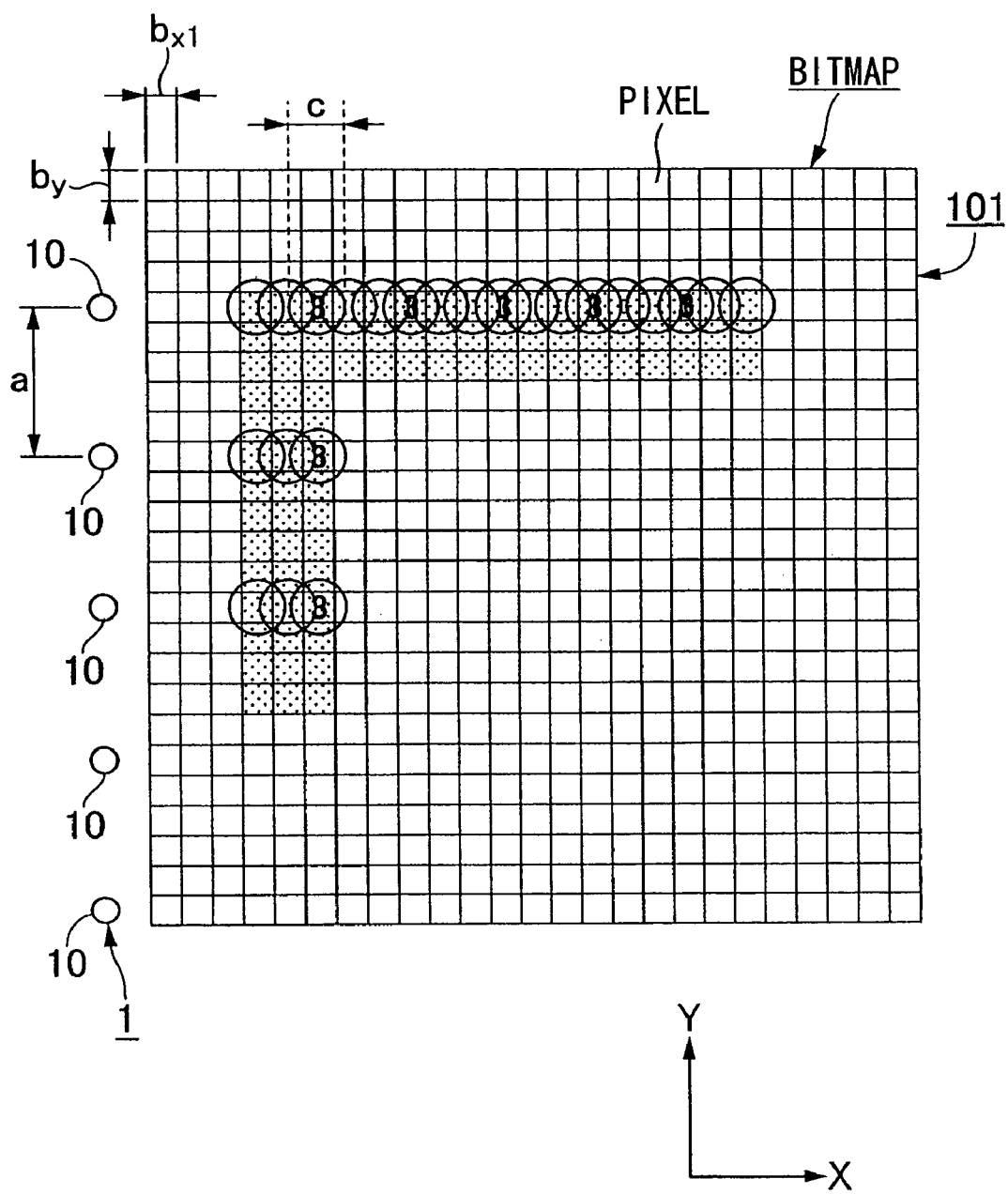
FIG. 6 is an explanatory view of the method of manufacturing a device of the present invention.

FIG. 6 is a typical view when the liquid drops have been discharged upon the substrate 101 from the discharge nozzles 10 by a third episode of scanning. It should be understood that, in FIG. 6, "3" is appended to the liquid drops which have been discharged by the third scanning episode. During the third scanning episode as well, the discharge operation is performed while opening up two pixels' worth in the X axis direction. Furthermore, during the third scanning episode, the liquid drops which have impacted also wet and spread out upon the substrate 101 so as to have the diameter c.

Here, due to three episodes of scanning and discharge operation, in the figure, the liquid drops are continuous at the uppermost level (the +Y side).

Figure 7:
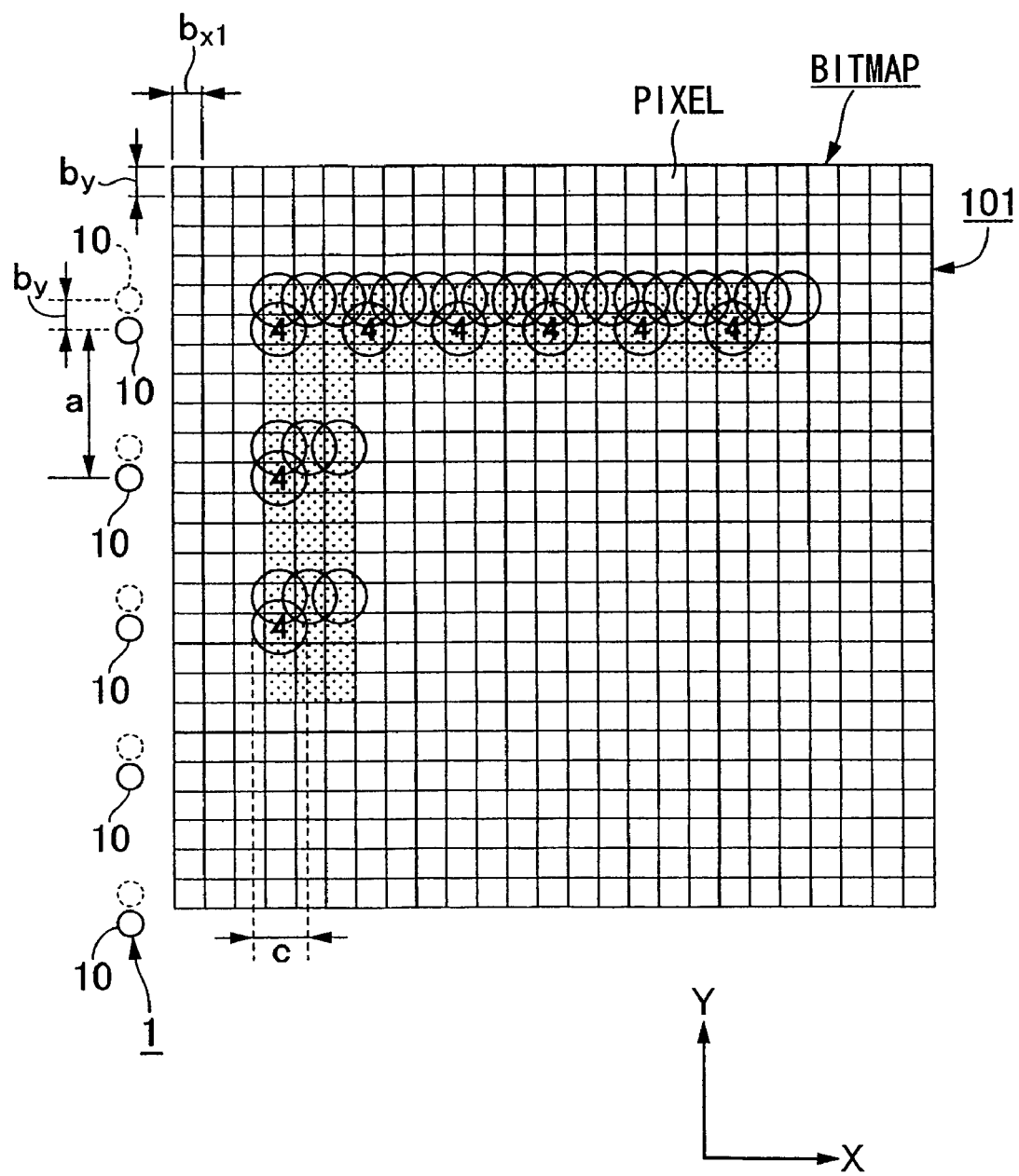
FIG. 7 is an explanatory view of the method of manufacturing a device of the present invention.

FIG. 7 is a typical view when the liquid drops have been discharged upon the substrate 101 from the discharge nozzles 10 by a fourth episode of scanning. Here, in the fourth episode of scanning, the liquid drop discharge head 1 and the substrate 101 which is supported upon the stage 7 are relatively step shifted in the Y axis direction. In this embodiment, the substrate 101 which is supported upon the stage 7 is step shifted in the Y axis direction.

Here, the substrate 101 is step shifted in the Y axis direction by just a positive integral multiple of the size $b_y$ of the pixels in the Y axis direction. In FIG. 7, the example is shown in which the substrate 101 has been step shifted in the Y axis direction by just one times $b_y$ (in other words by $b_y$) with respect to the liquid drop discharge head 1.

Having been shifted by just the distance $b_y$, the liquid drop discharge head 1 discharges liquid drops against the substrate 101 while scanning in the X axis direction. It should be understood that, in FIG. 7, "4" is appended to the liquid drops which have been discharged by the fourth scanning episode. Furthermore, during the fourth scanning episode, the liquid drops which have impacted also wet and spread out upon the substrate 101 so as to have the diameter c.

Here it would also be acceptable, after having step shifted, when performing the discharge operation, to arrange to discharge the liquid drops along the Y axis direction so that the liquid drops which have been disposed upon the substrate 101 do not mutually overlap, or so as to generate an overlap of 10% or less of the diameter of the liquid drops when they have been disposed upon the substrate 101. In other words, it would also be acceptable to arrange to step shift by setting the distance of the step shift to, for example, three times $b_y$. By doing this, it is possible to prevent the occurrence of bulges along the Y axis direction as well, when for example the liquid drops "1" are wetting.

On the other hand, with the example shown in FIG. 7, in consideration of the fact that the liquid drops "1" are ones which have dried, in this case, it would also be acceptable for "1" and "4" to overlap by 10% or more of the diameter c.

Figure 8:
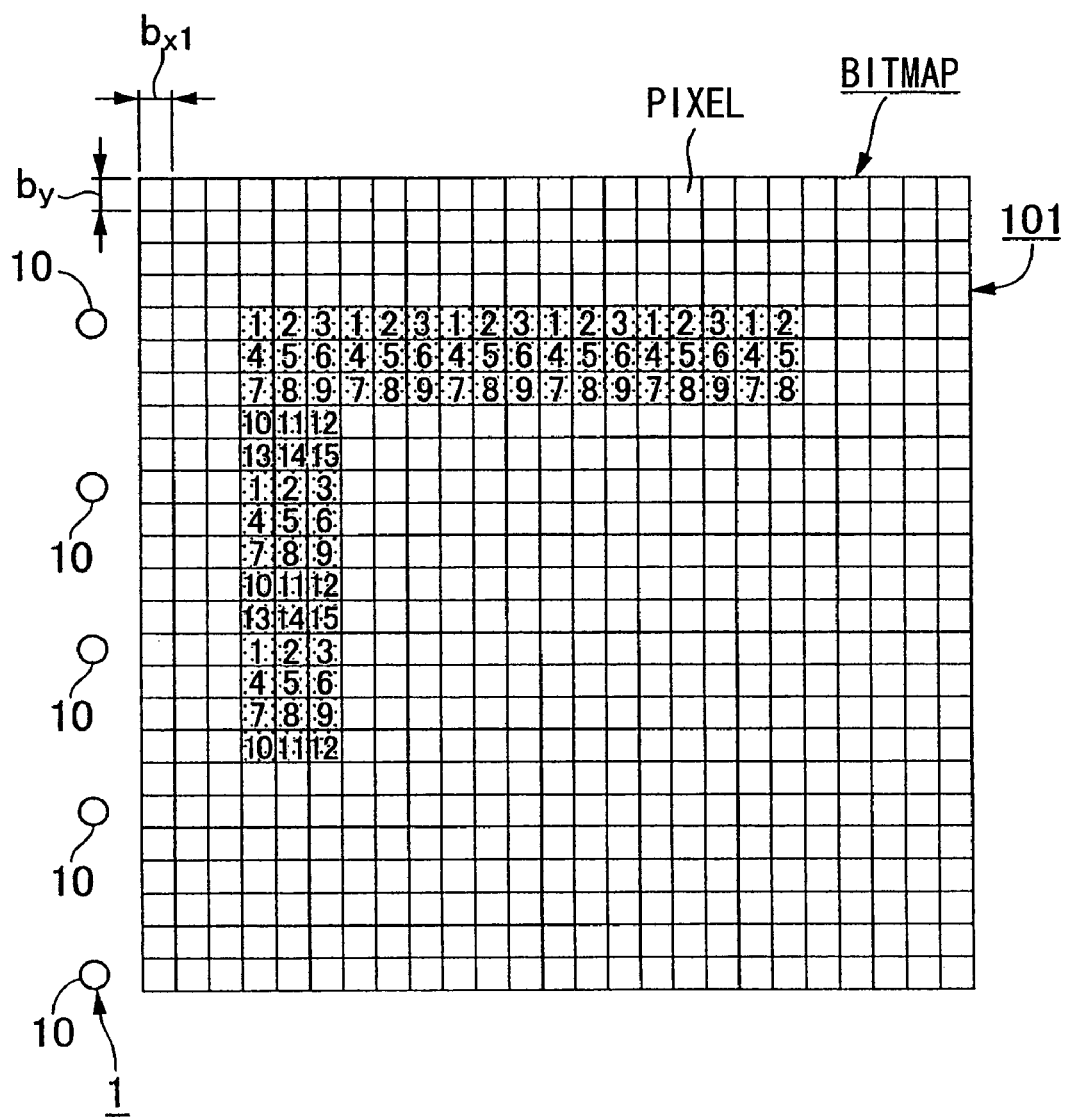
FIG. 8 is an explanatory view of the method of manufacturing a device of the present invention.

In the following, in the same manner, discharge operation while performing scanning and step shifting are repeated. And in this embodiment, as shown in FIG. 8, liquid drops are discharged against each of the pixels corresponding to the region shown in grey in the figure by performing a total of 15 scanning episodes. It should be understood that, in FIG. 8, "n" is appended to the liquid drops which have been discharged during the nth scanning episode.

It should be understood that, since the liquid drops which have been discharged wet and spread out upon the substrate 101, the wiring pattern which is actually formed becomes widened out from the region which is shown in grey in the figure. Accordingly, when forming the wiring pattern, the pattern design is performed while considering the amount of this wetting and spreading out. Here, surface processing including liquid attraction processing and liquid repellent processing according to the characteristics of the material in liquid form with respect to the substrate 101 is performed, in order to obtain the desired contact angle, since the quality of the wetting and spreading out of the liquid drops upon the substrate 101 is determined by the angle of contact of the substrate 101 and the liquid drops. By doing this, it is possible to form the wiring pattern including the desired width.

As has been explained above, this embodiment is constructed so as to establish the bitmap upon the substrate 101, and so as then to discharge the liquid drops against the pixels of this bitmap. And, when establishing the bitmap, by setting it up so that the size $b_y$ in the Y axis direction of the bitmap and the interval "a" of the discharge nozzles 10 define an integer ratio, it is possible to make the discharge nozzles 10 and the pixels agree with one another, even without making the liquid drop discharge head incline, for example, with respect to the Y axis. Accordingly, it is possible to discharge the liquid drops against the desired pixels without any requirement for performing complicated control in relation to the discharge operation. By setting the bitmap, in other words the pattern design rules, according to the interval a of the discharge nozzles 10 in this manner, it is possible to make the discharge nozzles 10 and the pixels agree with one another, so that it is possible to perform discharge operation against the desired positions with good accuracy without reducing the speed of scanning.

In this embodiment, the size $b_{x1}$ of the pixels in the X axis direction and their size $b_y$ in the Y axis direction are the same, and the pixels are set to be squares. By doing this, it is possible easily to perform pattern design. It should be understood that if, as in this embodiment, scanning is performed while making the discharge head 1 (the direction in which the discharge nozzles 10 are lined up) and the Y axis direction to agree with one another, then it is not absolutely necessary for the size $b_{x1}$ of the pixels in the X axis direction to be the same as their size $b_y$ in the Y axis direction; any size would be acceptable.

Since, when discharging the liquid drops upon the substrate 101, it is arranged to discharge the liquid drops along the X axis direction so that the liquid drops which have been disposed upon the substrate 101 do not overlap one another, or so that an overlap is generated of equal to or less than 10% of the diameter c of the liquid drops when they have been disposed upon the substrate 101, accordingly it is possible to avoid providing an excess of the material in liquid form upon the substrate 101 in a single episode of scanning, so that it is possible to prevent the occurrence of bulges.

Since, when step shifting the liquid drop discharge head 1 and the substrate 101 in the Y axis direction, it is arranged to step shift them in the Y axis direction by just a positive integer multiple of the size $b_y$ of a single pixel, accordingly it is possible to make the discharge nozzles 10 and the pixels agree with one another even after the step shifting.

Figure 10:
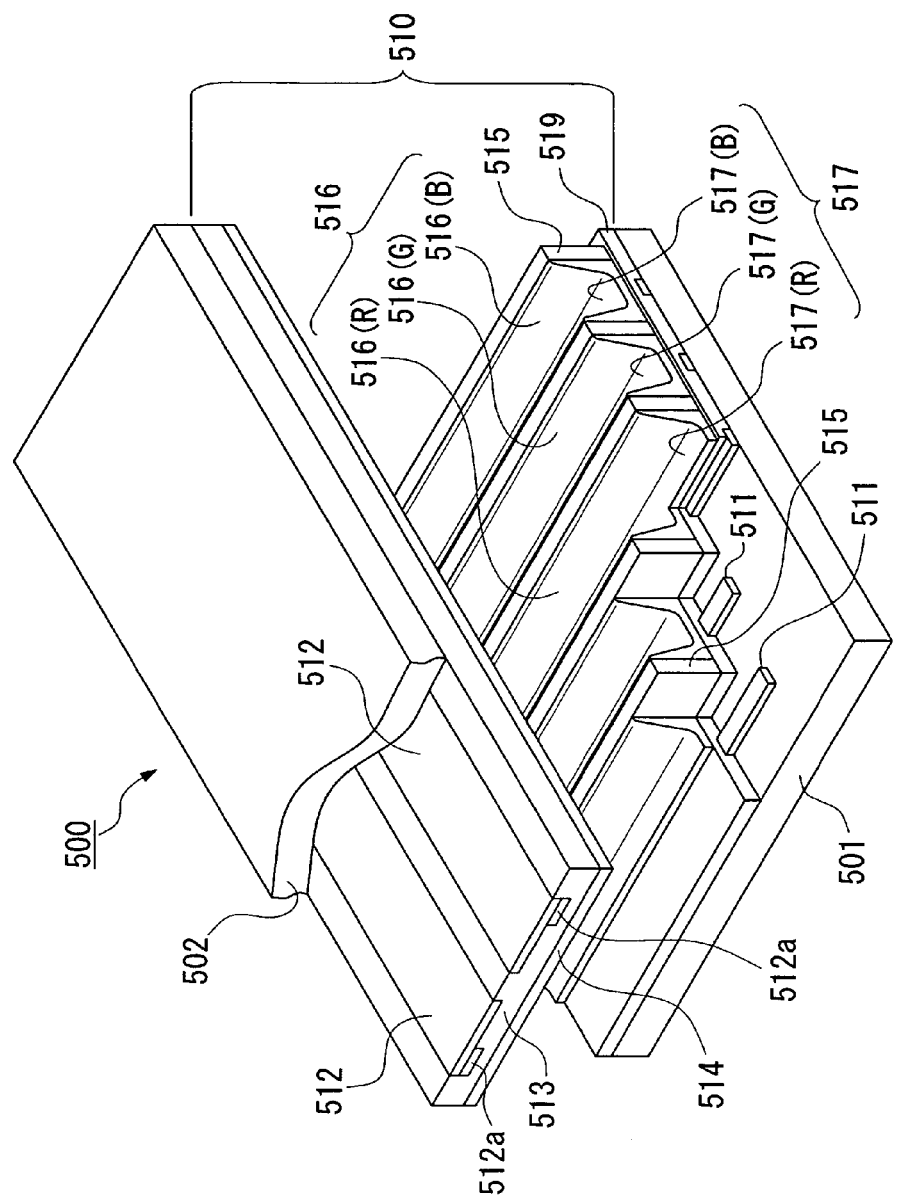
FIG. 10 is a figure showing an example of a device of the present invention, and is an exploded perspective view showing a plasma type display device.

It should be understood that although, with the above described embodiment, it is arranged to determine the pixel size based upon the interval "a" of the discharge nozzles 10, and then to perform the liquid drop discharge process, also, if it is arranged, when performing patterning upon the substrate with a process previous or subsequent to the liquid drop discharge process, for example in a photolithography process when manufacturing a plasma type display device as an electro-optical device as shown in FIG. 10, to perform the design and the patterning based upon the interval "a" of the discharge nozzles 10 or upon 1/n-th thereof (where n is an integer greater than or equal to 2), then it is possible to design the bitmap for discharge so as to make the pattern which has been formed by this previous or subsequent process and the pattern which has been patterned by the liquid drop discharge process to accurately agree with one another.

The plasma type display device 500 shown in FIG. 10 is schematically made up from a glass substrate 501 and a glass substrate 502 which are arranged so as mutually to confront one another, and an electrical discharge display section 510 which is formed between these.

In the electrical discharge display section 510, a plurality of electrical discharge chambers 516 are collected together, and, among this plurality of electrical discharge chambers 516, three electrical discharge chambers 516—a red color electrical discharge chamber 516(R), a green color electrical discharge chamber 516(G), and a blue color electrical discharge chamber 516(B)—are grouped together and are arranged so as to form a single picture element.

Address electrodes 511 are formed in stripe form at predetermined intervals upon the upper surface of the (glass) substrate 501, a dielectric layer 519 is formed so as to cover over the upper surfaces of these address electrodes 511 and of the substrate 501, and division walls 515 are further formed over the dielectric layer 519 as positioned between the address electrodes 511, 511 and so as to extend along each of the address electrodes 511. It should be understood that rectangular regions are formed which are separated by division walls at predetermined positions in the lengthwise directions of the division walls 515, in the direction orthogonal to the address electrodes 511, and separated at predetermined intervals (not shown in the figure), basically neighboring both the left and right sides in the widthwise directions of the address electrodes 511, and by the division walls which are provided as extending in the orthogonal direction to the address electrodes 511, an electrical discharge chamber 516 is formed so as to correspond to these rectangular regions, and single picture elements are constituted by these rectangular regions being grouped into sets of three. Furthermore, fluorescent masses 517 are disposed in the interiors of the rectangular regions which are defined by the division walls 515. Since these fluorescent masses 517 emit red, green, or blue light by fluorescence, a red colored fluorescent mass 517(R) is disposed at the bottom portion of the red color electrical discharge chamber 516(R), a green colored fluorescent mass 517(G) is disposed at the bottom portion of the green color electrical discharge chamber 516(G), and a blue colored fluorescent mass 517(B) is disposed at the bottom portion of the blue color electrical discharge chamber 516(B), respectively.

Next, on the side of said glass substrate 502, along with a plurality of transparent display electrodes 512 made from ITO being formed in stripe form at predetermined intervals in the direction orthogonal to the previous address electrodes 511, bus electrodes 512a are formed which are made from a metal, in order to compensate for the ITO which is of high resistance. Furthermore, covering over these, there are formed a dielectric layer 513 and also a protective film 514 which is made from MgO or the like.

And said substrate 501 and the substrate 2 of the glass substrate 502 are mutually adhered together with said address electrodes 511 and display electrodes 512 confronting one another so as to be mutually orthogonal, and an electrical discharge chamber 516 is formed by exhausting the air from the empty space portion which is surrounded by the substrate 501, the division walls 515, and the protective layer 514 which is formed on the glass substrate 502 side, and by including inert gas therein. It should be understood that the display electrodes 512 which are formed on the side of the glass substrate 502 are formed so that two each are disposed with respect to each of the electrical discharge chambers 516.

The above described address electrodes 511 and display electrodes 512 are connected to an AC power source not shown in the figure, and, by directing electricity to these electrodes, the fluorescent masses 517 at the required positions of the electrical discharge display section 510 are excited and caused to emit light, so that it becomes possible to provide a color display.

In this embodiment, the display electrodes 512 are formed by a photolithographic method, while the bus electrodes 512a are formed by a liquid drop discharge method. And the interval between the display electrodes 512 which are formed by the photolithographic method is set (designed) based upon the interval "a" of the discharge nozzles 10 of the liquid drop discharge head 1, and the photolithographic process for forming the display electrodes 512 is performed based upon this value which has been set.

In concrete terms, if the interval "a" of the discharge nozzles 10 is for example 141 μm, and n is set to equal 10, then the pattern (interval and width) of the ITO transparent display electrodes 512 is designed by taking $^{141}/_{10}$=14.1 μm as the basic unit, and the display electrodes 512 are formed by a photolithographic method based upon this design value. In this case, the interval between the display electrodes 512 may be set to, for example, 14.1×40=564 μm, and the width of the display electrodes 512 may be set to, for example, 14.1×35=493.5 μm, or the like.

It should be understood that, although the case of making the display electrode 512 has been explained here by way of example, other portions, such as for example extended electrodes at both ends not shown in the figure and the like, are also designed in basic units of 14.1 μm.

As has been explained above, a value based upon the interval a of the discharge nozzles 10 is taken as the basic unit, and it is ensured that the design when forming a pattern with a method other than a liquid drop discharge unit (a photolithographic method) is performed based upon said basic unit; so that, as has been explained using FIG. 10, even when forming the bus electrodes 512a by a liquid drop discharge method, their position is accurately adjusted with respect to the transparent ITO display electrodes 512 which have been formed by a photolithographic method, so that it is possible to use the discharge nozzles 10 with good efficiency, and it is possible to form the pattern at a pitch which agrees perfectly with the underlying structural material (in other words, with the display electrode 512).

Here, there is some restriction upon the process which is included before or after the liquid drop discharge process; for example, the case should be considered when it is not possible to set the size of the pixels in the Y axis direction to set based upon the interval "a" of the discharge nozzles 10.

Figure 9A:
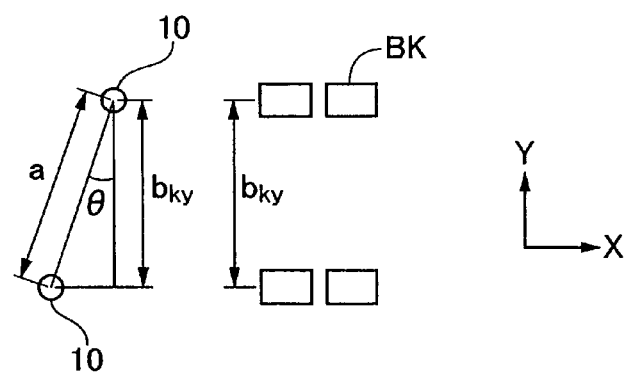
FIGS. 9A and 9B are explanatory views of another embodiment of the method of manufacturing a device of the present invention.

For example, as shown in FIG. 9A, when a plurality of structural elements (banks) BK for setting the positions of arrangement of the liquid drops upon the substrate are provided, the pitch $b_{ky}$ in the Y axis direction of these structural elements is regulated to a defined value, and the case should be considered when it is not possible to set the size of the pixels in the Y axis direction to set based upon the interval "a" of the discharge nozzles 10. Since there are restrictions upon the photolithographic process by which the structural elements BK are formed and it is not possible to design the value of $b_{ky}$ freely, there are cases in which an integer n which satisfies $b_{ky}=a/n$ does not exist, or in which, undesirably, n becomes an integer which is greater than is realistic.

In this type of case, it is effective to perform the discharge operation while inclining the liquid drop discharge head 1 at an angle θ to the Y axis. In this case, although in the prior art it was not possible to make the discharge nozzles and the pixels agree with one another in the X axis direction, by setting the size $b_{y2}$ in the Y axis direction and the size $b_{x2}$ in the X axis direction of the pixels (the unit regions) for discharge of the liquid drops so as to satisfy the conditions:

$b_{y2}=b_{ky}/n$ (where $n$ is a positive integer), and $b_{x2}=(a \cdot \sin θ)/m$ (where $m$ is a positive integer), it is possible to make the discharge nozzles 10 and the pixels agree with one another.

To put it in another way, the angle θ is set so that the specifed value $b_{ky}$ and $a \cdot \cos θ$ have an integral ratio to one another, and the size $b_{x2}$ in the X axis direction of the unit regions (pixels) is set based upon this angle θ and the nozzle interval "a" which have been set.

Figure 9B:
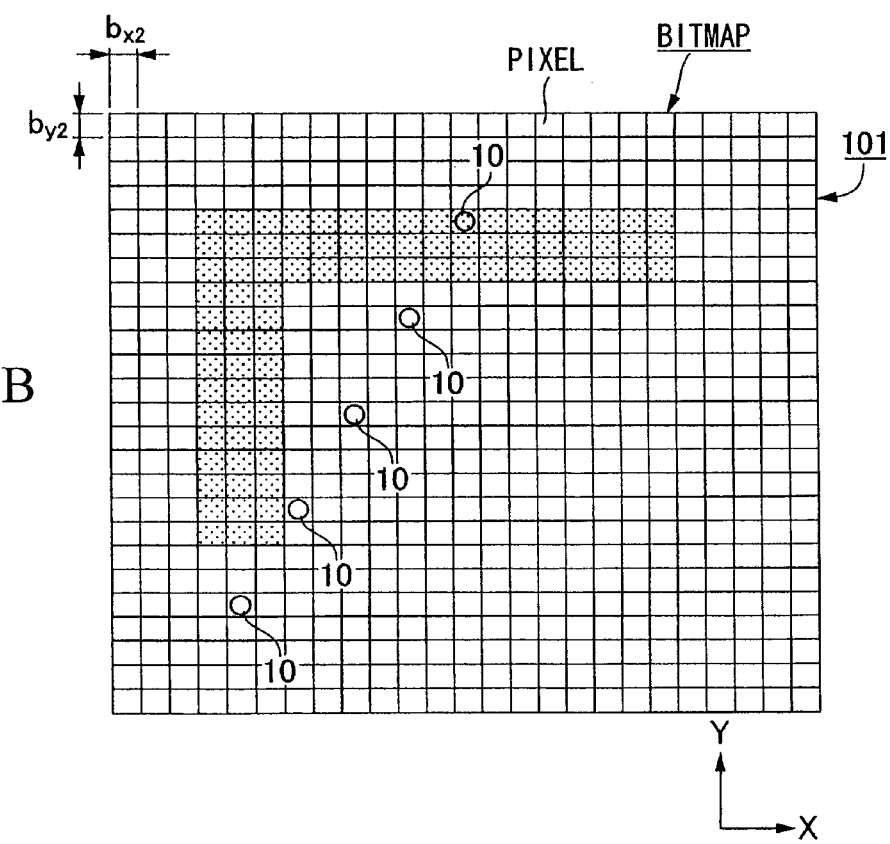

By making the setting as above, as shown in the typical view of FIG. 9B, it is possible to perform the liquid drop discharge operation while scanning the discharge nozzles 10 and the substrate 101 and making each pixel of the bitmap and a discharge nozzle agree with one another.

Figure 11:
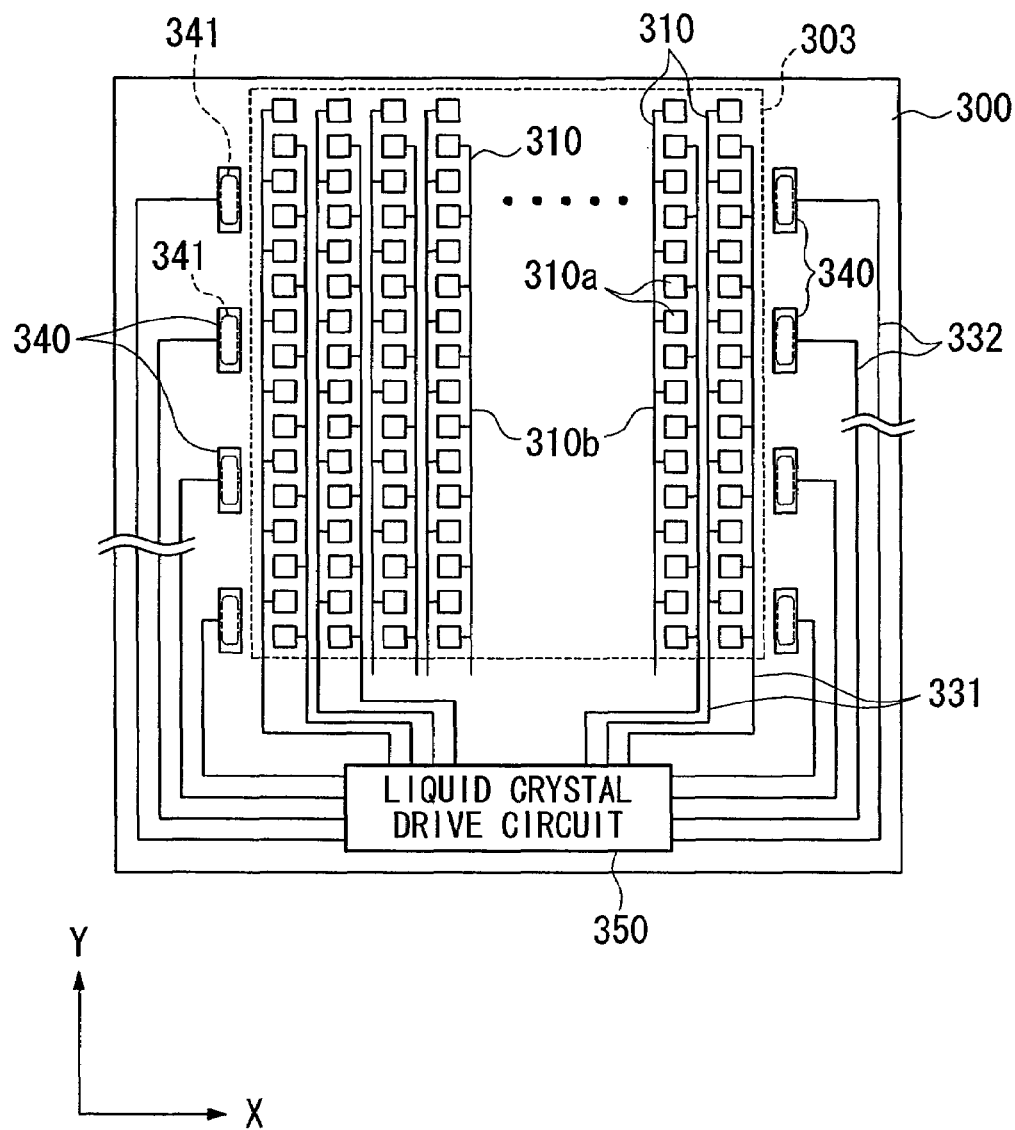
FIG. 11 is a figure showing an example of a device of the present invention, and is a plan view showing a liquid crystal display device.

The method of manufacturing a device of the present invention can be applied when making the liquid crystal device shown in FIG. 11. FIG. 11 is a figure showing the planar layout of signal electrodes and so on upon a first substrate of a liquid crystal device. This liquid crystal device is schematically made up from this first substrate, a second substrate (not shown in the figures) upon which scanning electrodes and so on are provided, and a liquid crystal (not shown in the figures) which is sealed between the first substrate and the second substrate.

As shown in FIG. 11, a plurality of signal electrodes 310 are provided in a multiple matrix form in a picture element region 303 upon the first substrate 300. In particular, each of the signal electrodes 310 is made up from a plurality of picture element electrode portions 310a which are provided to correspond to each of the picture elements, and a signal wiring portion 310b which is connected in multiple matrix form, and it extends along the Y direction.

Furthermore, the reference symbol 350 denotes a liquid crystal drive circuit of a single chip structure, and the one ends (the lower ends in the figure) of the signal wiring portions 310b and this liquid crystal drive circuit 350 are connected together via first extension wires 331.

Furthermore, the reference symbol 340 denotes upper and lower electroconductive terminals, and these upper and lower electroconductive terminals 340 and terminals which are not shown on the figure provided upon the second substrate are connected together by upper and lower electroconductive material 341. Furthermore, the upper and lower electroconductive terminals 340 and the liquid crystal drive circuit 350 are connected together via second extension wires 332.

In this embodiment, all of the signal wiring portions 310b, the first extension wires 331, and the second extension wires 332 provided upon the above described first substrate 300 are formed based upon the method of manufacturing a device according to the present invention.

Concrete examples of electronic apparatuses of the present invention will now be explained.

Figure 12A:
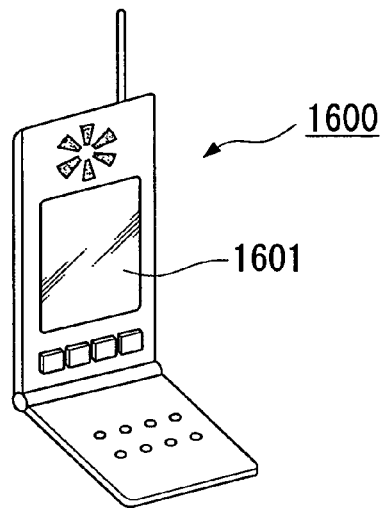
FIGS. 12A through 12C are figures showing an electronic apparatus of the present invention.

FIG. 12A is a perspective figure showing an example of a portable telephone. In FIG. 12A, 1600 denotes the main body of the portable telephone, while 1601 denotes a display section comprising the above described plasma type display device (or a liquid crystal display device, or an organic electroluminescence device).

Figure 12B:
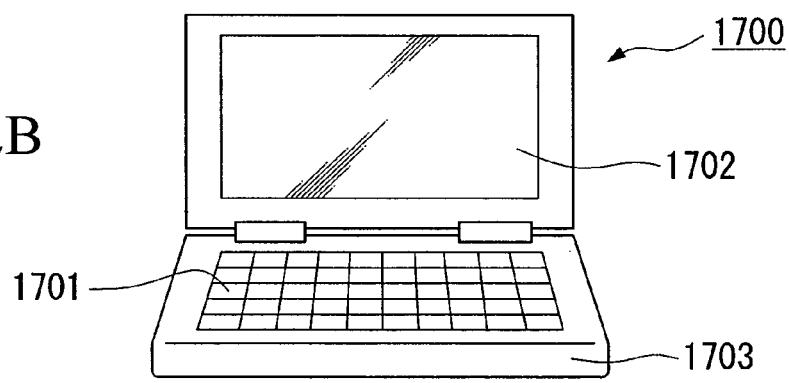

FIG. 12B is a perspective figure showing an example of a portable type information processing device such as a word processor, a personal computer, or the like. In FIG. 12B, 1700 denotes the information processing device, 1701 denotes an input section such as a keyboard or the like, 1703 denotes an information processing main body, and 1702 denotes a display section comprising the above described plasma type display device (or a liquid crystal display device).

Figure 12C:
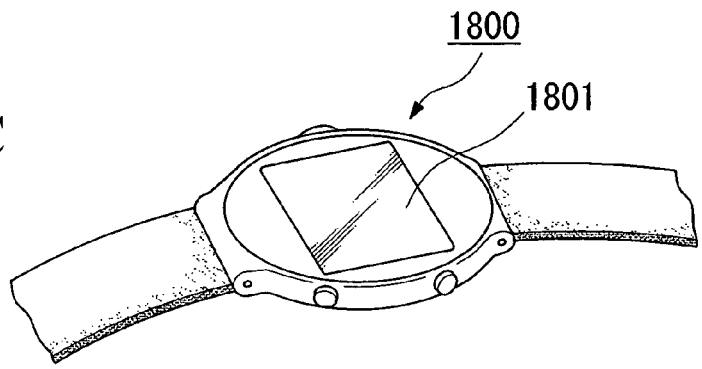

FIG. 12C is a perspective figure showing an example of a wristwatch type electronic apparatus. In FIG. 12C, 1800 denotes the main body of the watch, 1801 denotes an input section such as a keyboard or the like, while 1801 denotes a display section comprising the above described plasma type display device (or a liquid crystal display device).

The electronic apparatuses shown in FIGS. 12A through 12C have excellent display functions, since they are ones which incorporate display devices of the above described embodiment.

It should be understood that, although the above described electronic apparatuses are ones which incorporate plasma type display devices or liquid crystal devices, it is also possible to consider electronic apparatuses which incorporate organic electroluminescence display devices or the like, or other electro-optical devices.

Figure 13:
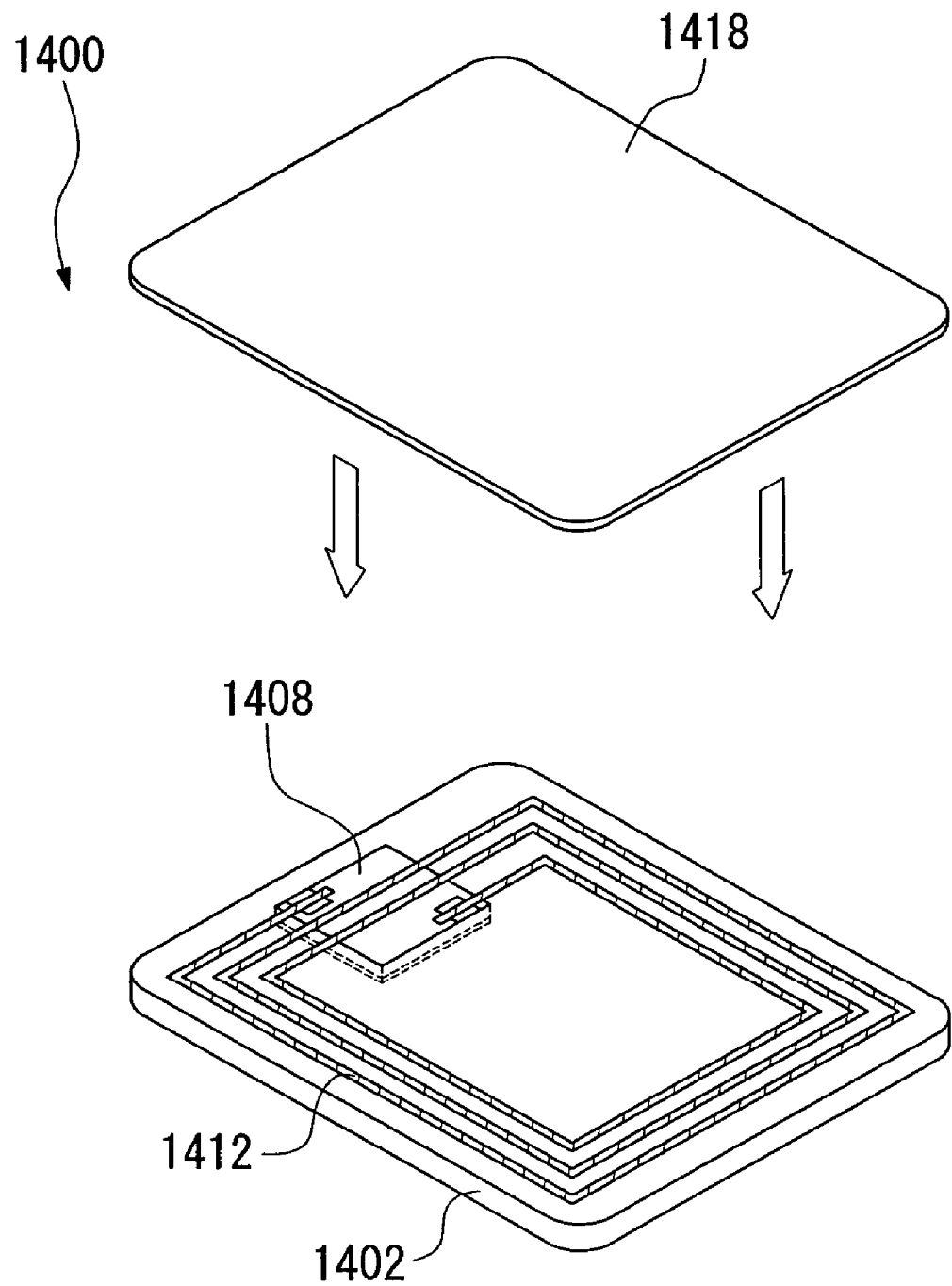
FIG. 13 is a figure showing an example of a device of the present invention, and is an exploded perspective view of a non contact type card medium.

FIG. 13 is a figure showing an example of a non contact type card medium, as a device of the present invention. As shown in FIG. 13, in the non contact type card medium 1400, a semiconductor integrated circuit chip 1408 and an antenna circuit 1412 are housed in a chassis made up from a card base 1402 and a card cover 1418, and they are made to perform at least one of electrical power supply and data transmission and reception with an external transmitter/receiver not shown in the figures by at least one of electromagnetic waves and capacitance coupling.

In this embodiment, the above described antenna circuit 1412 is made based upon the method of manufacturing of a device of the present invention.

It should be understood that although, in the above described embodiment, the case of forming a wiring pattern was explained, the method of manufacturing of the present invention can be applied to the manufacture of various sorts of apparatuses and devices, such as color filters the like. In the following, another example of application of the present invention will be explained.

Figure 14:
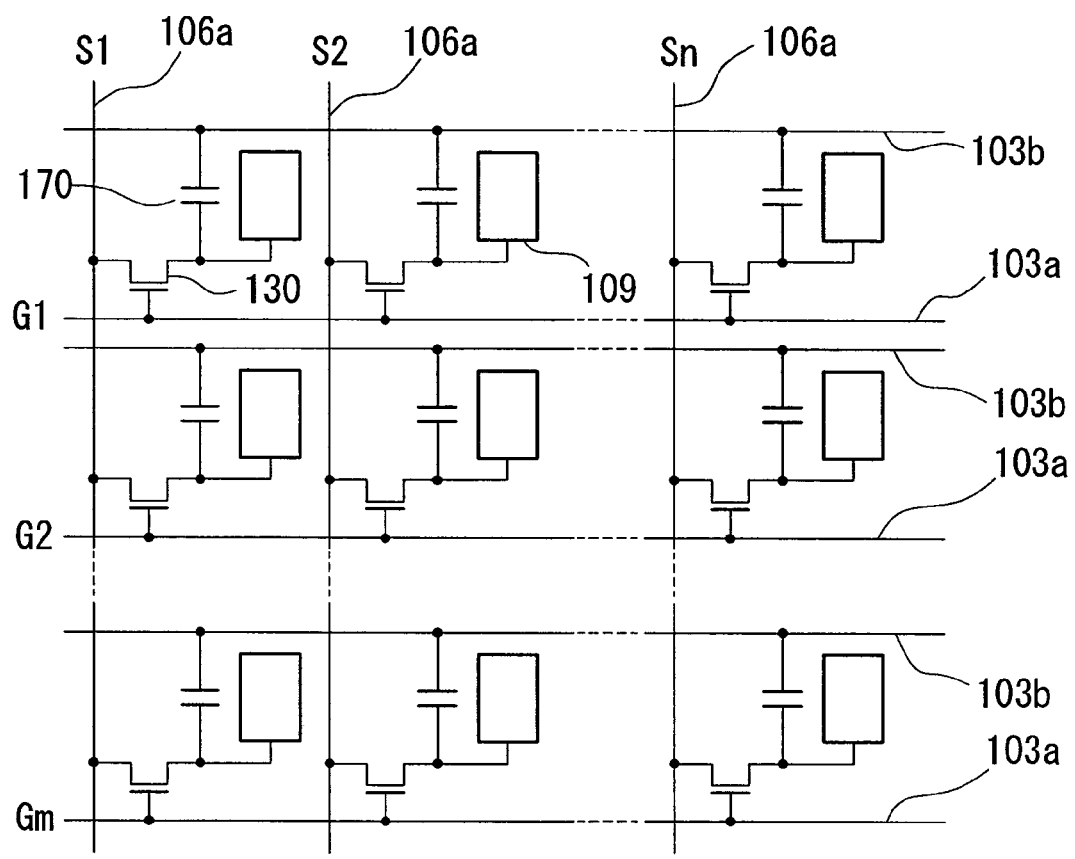
FIG. 14 is an equivalent circuit diagram of switching elements and signal lines and the like of a liquid crystal display device to which the method of manufacturing a device of the present invention is applied.
Figure 15:
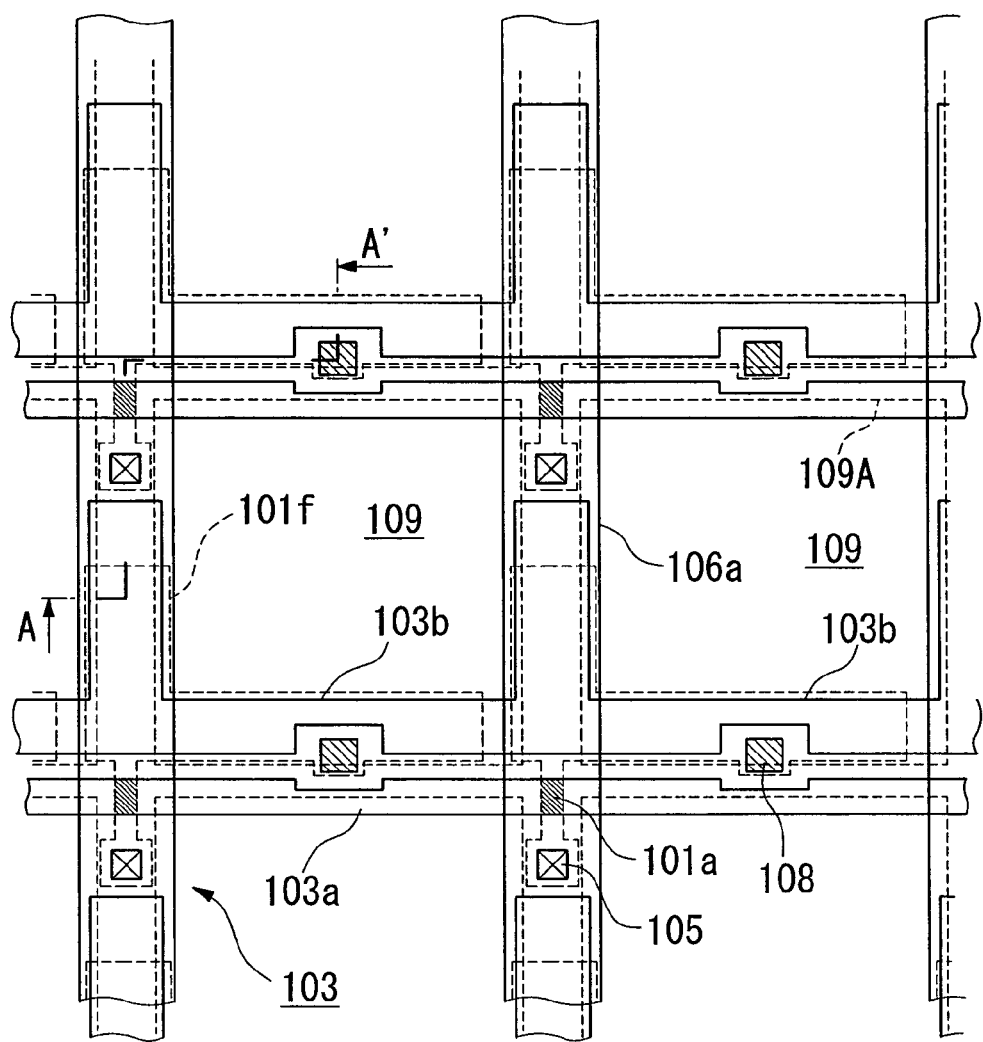
FIG. 15 is a plan view showing the structure of a TFT array substrate of a liquid crystal display device to which the method of manufacturing a device of the present invention is applied.
Figure 16:
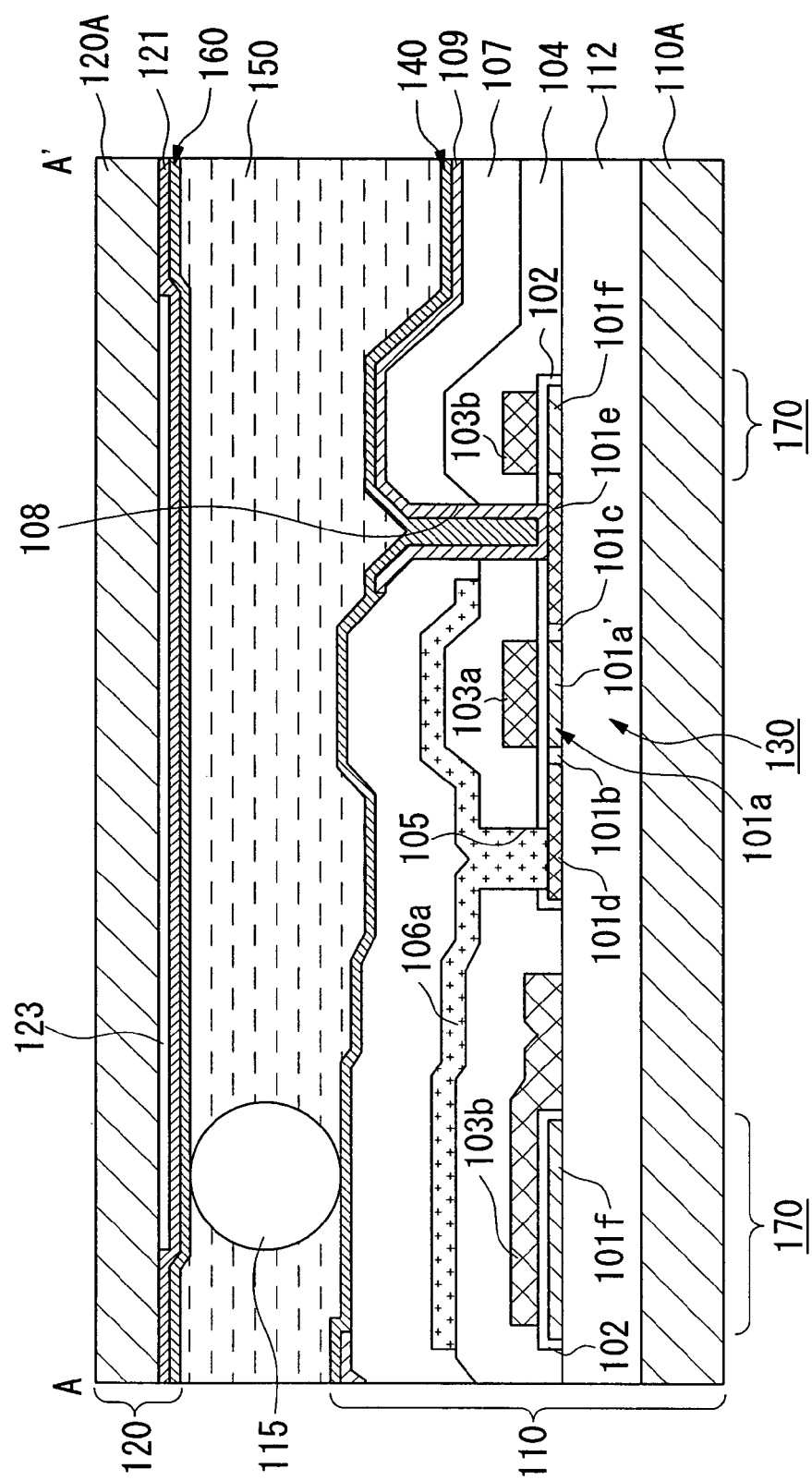
FIG. 16 is a general sectional view of a liquid crystal display device to which the method of manufacturing a device of the present invention is applied.

The present invention can be applied when manufacturing the liquid crystal display device shown in FIGS. 14 through 16. The liquid crystal display device of this embodiment is a transparent type liquid crystal device of the active matrix type which uses TFTs (Thin Film Transistors) as switching elements. FIG. 14 is an equivalent circuit diagram of switching elements, signal lines and so on for a plurality of picture elements of the transparent type liquid crystal device which are arranged in matrix form. FIG. 15 is a schematic plan view showing the structure of a group of a plurality of mutually adjacent picture elements of a TFT array substrate upon which data lines, scanning lines, picture element electrodes and the like have been formed. FIG. 16 is a sectional view of FIG. 15 along the lines A–A'. It should be understood that, in FIG. 16, the case is shown in which the upper side as seen in the figure is the light incident side, while the lower side as seen in the figure is the side which is looked at (the side of the observer). Furthermore the scale for each layer and for each member is different in each of the figures, in order to make each layer and each member be of a size which can be discerned in the figures.

In the liquid crystal display device of this embodiment, as shown in FIG. 14, picture element electrodes 109 and TFT elements 130 which are switching elements for perfoming power supply control to the picture element electrodes 109 are formed in each of the plurality of picture elements which are arranged in matrix form, and data lines 106a to which image signals are supplied are electrically connected to the sources of the TFT elements 130. Write image signals S1, S2, . . . Sn are supplied to the data lines 106a in this order in the order of the lines, or are supplied one group at a time to a plurality of mutually adjoining data lines 106a. Furthermore, scanning lines 103a are electrically connected to the gates of the TFT elements 130, and scanning signals G1, G2, . . . Gm are applied to the plurality of scanning lines 103a as pulses at predetermined timings in the order of the lines. Furthermore, the picture element electrodes 109 are electrically connected to the drains of the TFT elements 130, and, by turning the TFT elements 130, which are switching elements, ON just at predetermined time intervals, the image signal S1, S2, . . . Sn which are supplied from the data lines 106*a* are written at predetermined timings. The image signals S1, S2, . . . Sn of a predetermined level which have been written in to the liquid crystal via the picture element electrodes 109 are maintained between them and a common electrode which will be described hereinafter. The liquid crystal is capable of modulating light and displaying tones by changing the orientation or the order of its molecular self-assembly due to the voltage level which is applied. Here, in order to prevent leakage of the signal which has been maintained, capacitors 170 are added in parallel with the liquid crystal capacitances which are formed between the picture element electrodes 109 and the common electrode.

Next, the planar structure of the liquid crystal display device of this embodiment will be explained while referring to FIG. 15. As shown in FIG. 15, a plurality of rectangular picture element electrodes 109 (whose contours are shown by the dotted line portions 109A) made from a transparent electroconductive material such as indium tin oxide (hereinafter abbreviated as ITO) or the like are provided as arranged in matrix form upon a TFT array substrate,and data lines 106*a*, scanning lines 103*a*, and capacitance lines 103*b* are provided, each along the vertical and horizontal boundaries of the picture element electrodes 109. Each of the picture element electrodes 109 is electrically connected to a TFT element 103 which is provided to correspond to each intersecting portion of a scanning line 103*a* and a data line 106*a*, and is made so as to be able to perform display to each picture element. The data lines 106*a* are electrically connected via contact holes 105 to source regions which will be described hereinafter of a semiconductor layer 101*a*, which is made from, for example, a polysilicon layer, and which constitutes the TFT elements 130; and the picture elements 109 are electrically connected via contact holes 108 to drain regions which will be described hereinafter of the semiconductor layer 101*a*. Furthermore, the scanning lines 103*a* are arranged so as to confront channel regions (the diagonally hatched regions at the upper left in the figure) which will be described hereinafter of the semiconductor layer 101*a*, and the scanning lines 103*a* function as gate electrodes at the portions which oppose the channel regions. The capacitance lines 103*b* comprise main line portions which extend approximately in straight line form along the scanning lines 103*a* (in other words, as seen in a plane, first regions which are formed along the scanning lines 103*a*), and projecting portions which are projected to the front stage sides (upper direction in the figures) along the data lines 106*a* from the positions of intersection with the data lines 106*a* (in other words, as seen in a plane, second regions which are provided as extending along the data lines 106*a*).

Next, the cross sectional structure of the liquid crystal display device of this embodiment will be explained while referring to FIG. 16. FIG. 16, as has been stated above, is a sectional view along the lines A–A' in FIG. 15, and shows the structure of a region in which a TFT element 130 is formed. With the liquid crystal display device of this embodiment, the liquid crystal layer 150 is sandwiched between the TFT array substrate 110 and an opposing substrate 120 which is arranged to oppose it. The TFT array substrate 110 is made up mainly from a substrate main body 110A which is transparent to light, the TFT elements 130 which have been formed on the liquid crystal layer 150 side surface thereof, the picture element electrodes 109, and an orientation layer 140; while the opposing substrate 120 is made up mainly from a plastic substrate (substrate main body) 120A which is transparent to light, a common electrode 121 which has been formed on the liquid crystal layer side surface thereof, and an orientation layer 160. And a predetermined substrate interval (gap) is maintained between these substrates 110 and 120 via a spacer 115. In the TFT array substrate 110, the picture element electrodes 109 are provided on the liquid crystal layer 150 side surface of the substrate main body 110A, and, in positions adjacent to each of the picture element electrodes 109, there are provided TFT elements 130 for picture element switching, which perform switching control of the picture element electrodes 109. These TFT elements 130 for picture element switching are endowed with a LDD (Lightly Doped Drain) structure, and comprise the scanning lines 103*a*, channel regions 101*a*' of the semiconductor layer 101*a* in which channels are formed by the electric field from the scanning lines 103*a*, a gate insulation layer 102 which insulates the scanning lines 103*a* and the semiconductor layer 101*a*, data lines 106*a*, low density source regions 101*b* and low density drain regions 101*c* of the semiconductor layer 101*a*, and high density source regions 101*d* and high density drain regions 101*e* of the semiconductor layer 101*a*. A second inter-layer insulation layer 104 is formed over the substrate main body 110A, including over the above described scanning lines 103*a* and over the gate insulation layer 102, with contact holes 105 which lead to the high density source regions 101*d* and contact holes 108 which lead to the high density drain regions 101*e* being opened through it. In other words, the data lines 106*a* are electrically connected to the high density source regions 110*d* via the contact holes 105 which are pierced through the second inter-layer insulation layer 104. Furthermore, a third inter-layer insulation layer 107 is formed over the data lines 106*a* and over the second inter-layer insulation layer 104, and contact holes 108 which lead to the high density drain regions 101*e* are opened through it. In other words, the high density drain regions 101*e* are electrically connected to the picture element electrodes 109 via the contact holes 108 which are pierced in the second inter-layer insulation layer 104 and in the third inter-layer insulation layer 107.

In this embodiment, a capacitive accumulator 170 is constituted by using the gate insulation layer 102 as a dielectric film which is provided as extending from positions which oppose the scanning lines 103*a*, by taking the semiconductor film 101*a* as a first extended capacitive accumulator electrode 101*f* and further, by taking portions of the capacitance lines 103*b* which oppose these elements as second capacitive accumulator electrodes. Furthermore, the first inter-layer insulation layer 112 is formed between the TFT array substrate 110A and the TFT element 130 for picture element switching, in order to electrically insulate the semiconductor layer 101*a* which constitutes the TFT element 130 for picture element switching from the TFT array substrate 110A. Yet further, the orientation layer 140 for controlling the orientation of the liquid crystal molecules in the liquid crystal layer 150 when voltage is not being applied is formed upon the extreme surface of the TFT array substrate 110 on the liquid crystal layer 150 side, in other words, over the picture element electrodes 109 and the third inter-layer insulation layer 107. Accordingly for the regions which are equipped with this type of TFT element 130, the extreme surface of the TFT array substrate 110 on the liquid crystal layer 150 side, comes to be constituted with a plurality of concavities and convexities and steps formed thereupon, in other words on the surface which sandwiches and holds the liquid crystal layer 150. On the other hand, upon the opposing substrate 120, in regions of the substrate main body 120A which are upon the liquid crystal layer 150 side surface, and which oppose the regions in which the data lines 106a, the scanning lines 103a, and the TFT elements 130 for picture element switching are formed (the non picture element regions), a second layer 123 which is opaque to light is provided for preventing incident light from penetrating to the channel regions 101a' or the low density source regions 101b or the low density drain regions 101c of the semiconductor layer 101a of the TFT element 130 for picture element switching. Furthermore, on the liquid crystal layer 150 side of the substrate main body 120A upon which the second layer 123 which is opaque to light is formed, over approximately its entire surface, there is formed the common electrode 121 which is made from ITO or the like, and, on the liquid crystal layer 150 side thereof, there is formed the orientation layer 160 which controls the orientation of the liquid crystal molecules within the liquid crystal layer 150 when voltage is not being applied.

In this embodiment, the data lines 106a, the scanning lines 103a which constitute the gate electrodes, the capacitance lines 103b, and the picture element electrodes 109 and the like are formed based upon the method of manufacture of the present invention.

Figure 17:
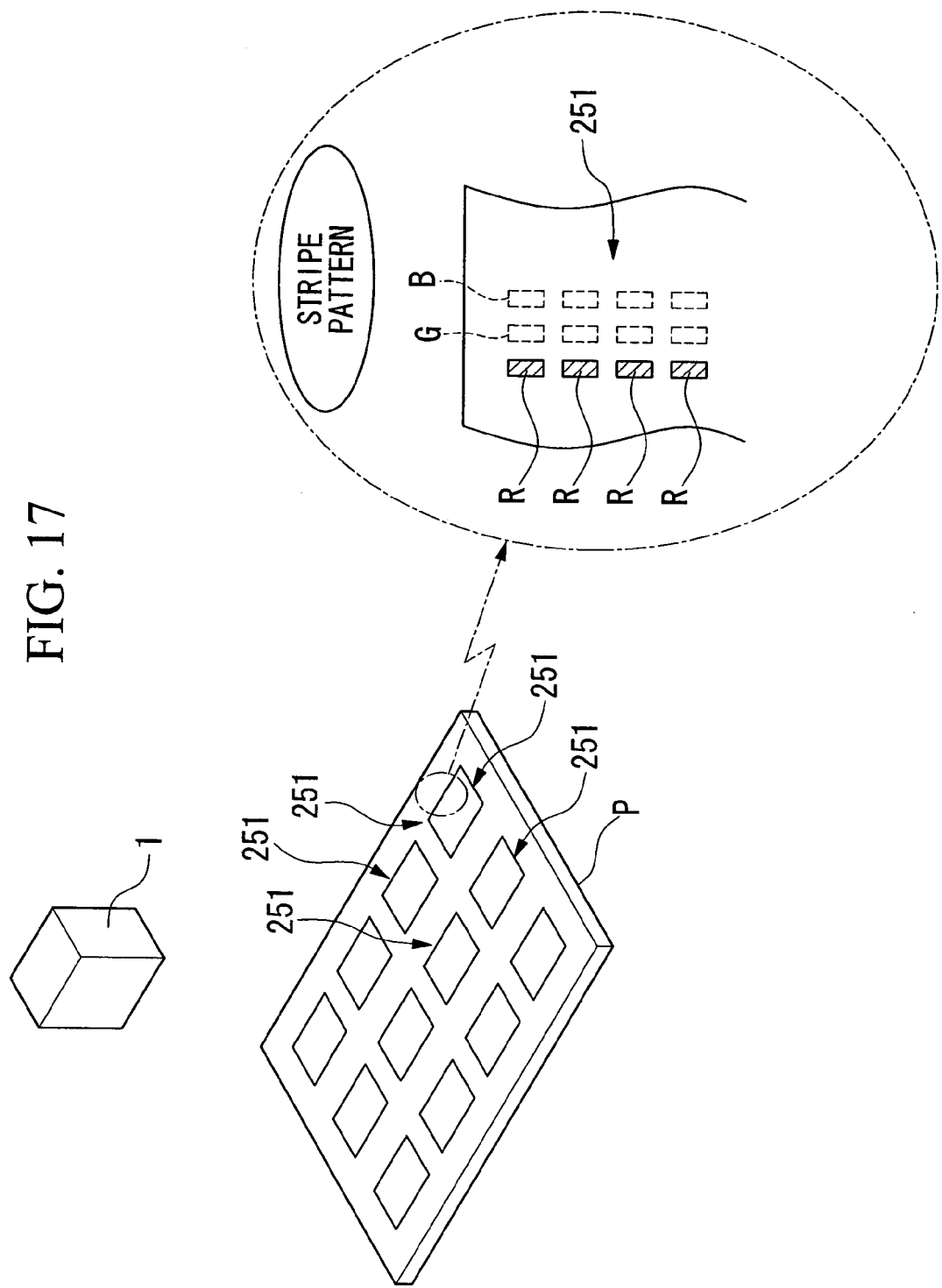
FIG. 17 is a typical view of a color filter to which the method of manufacturing a device of the present invention is applied.

The present invention can also be employed in formation of a film which becomes a structural component of a color filter FIG. 17 is a figure showing a color filter which has been formed upon a substrate P, while FIGS. 18A through 18F are figures showing the procedure of manufacture of the color filter. As shown in FIG. 17, in this example, from the point of view of enhancing the manifacturability, a plurality of color filter regions 251 are formed in matrix form upon a substrate P of rectangular form. By cutting up the substrate P afterwards, these color filter regions 251 can be used as color filters which are suitable for application in a liquid crystal display device. In this example, the color filter regions 251 are formed in a stripe form known from the prior art, with R (red) liquid state compound material, G (green) liquid state compound material, and B (blue) liquid state compound material in a predetermined pattern. It should be understood that, as this formation pattern, rather than a stripe pattern, a mosaic pattern, a delta pattern, a square pattern, or the like would also be acceptable. And the above described surfactant is added to each of the RGB liquid state compound materials.

Figure 18A:
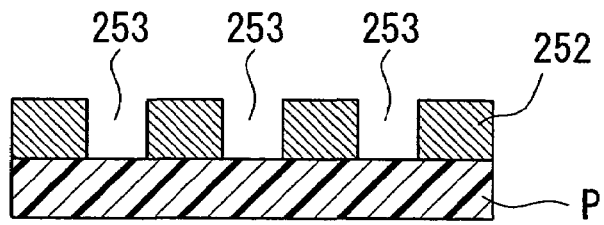
FIGS. 18A through 18F are typical views of a color filter to which the method of manufacturing a device of the present invention is applied.
Figure 18B:
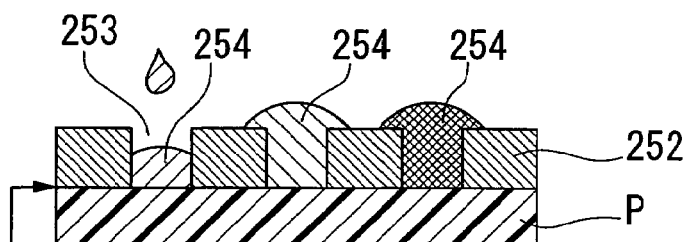
Figure 18C:
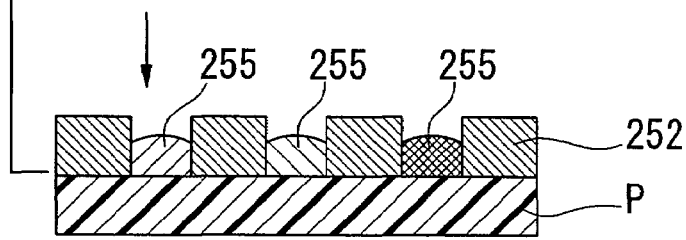
Figure 18D:
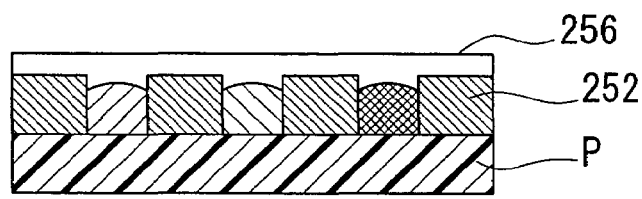
Figure 18E:
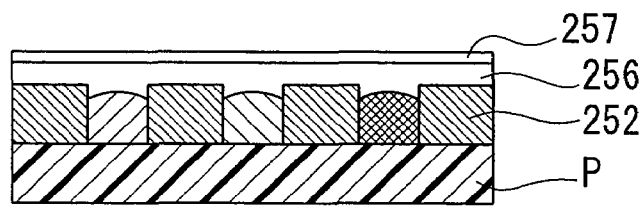
Figure 18F:
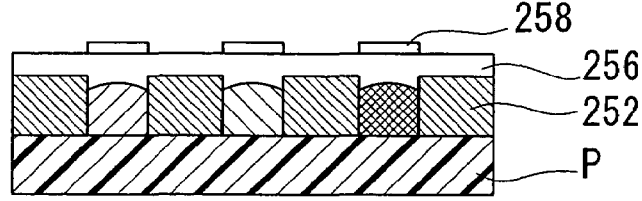

For forming the color filter regions 251 of this type, first banks 252 are formed upon one surface of a transparent substrate P, as shown in FIG. 18A. As the method for forming these banks 252, they are exposed to light after spin coating, and then are developed. The banks 252 are formed in the form of a lattice as seen in plan view, and ink is disposed in the bank interior portions which are surrounded by the lattice. At this time, the banks 252 desirably are endowed with liquid repellence. Furthermore, it is desirable for the banks 252 to function as a black matrix. Next, as shown in FIG. 18B, liquid drops 254 of liquid state compound material are discharged from the liquid drop discharge head, and impact against filter elements 253. With regard to the amounts of the liquid drops 254 which are discharged, they should be made to be of amounts which are sufficient in consideration of the volumetric reduction of the liquid state compound material in the heating process. When by doing this the liquid drops 254 have been filled into all the filter elements 253 upon the substrate P, the substrate P is subjected to heating processing using a heater, so as to be brought Lip to a predetermined temperature (for example about 70° C.). The solvent of the liquid state compound material is evaporated by this heat processing, and the volume of the liquid state compound material diminishes. If this volumetric phenomenon is very severe, the liquid drop discharge process and the heating process are repeated until sufficient film thickness as a color filter is obtained. By this processing, the solvent which is included in the liquid state compound material is evaporated, and finally only the solid component which is included in the liquid state compound material remains as a film, so that a color filter 255 results, as shown in FIG. 18C. Next the substrate P is planated, and furthermore, in order to protect the color filter 255, a protective layer 256 is formed over the substrate P, covering the color filter 255 and the banks 252. A method such as a spin coating method, a roll coating method, a ripping method or the like may be employed for forming this protective layer 256; but it is also possible to perform it by a liquid drop discharge method, in the same way as with the color filter 255. Next, as shown in FIG. 18E, a transparent electroconductive film 257 is formed over the entire surface of the protective layer 256 by a spattering method or a vacuum evaporation-deposition method or the like. After this, the transparent electroconductive layer 257 is patterned, and, as shown in FIG. 18F, picture element electrodes 258 are patterned to oppose the filter elements 253. It should be understood that this patterning becomes unnecessary if TFT are used for driving the liquid state display panel.

In this embodiment, it is possible to apply the method of manufacture of the present invention when forming the color filter 255 and/or the picture element electrode 258.

The present invention can also be applied in the case of manufacturing an organic EL device. A method of manufacturing an organic EL device will now be explained while making reference to FIGS. 19A through 19E, FIGS. 20A through 20C, and FIGS. 21 A through 21C. It should be understood that only a single picture element is shown in FIGS. 19A through 19E, FIGS. 20A through 20C, and FIGS. 21A through 21C, in order to simplify the explanation.

Figure 19A:
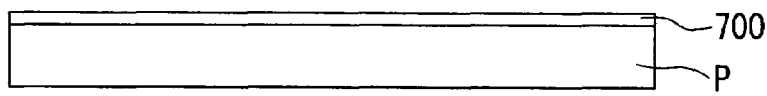
FIGS. 19A through 19E are typical views showing a process of manufacturing an organic EL device to which the method of manufacturing a device of the present invention is applied.
Figure 19B:
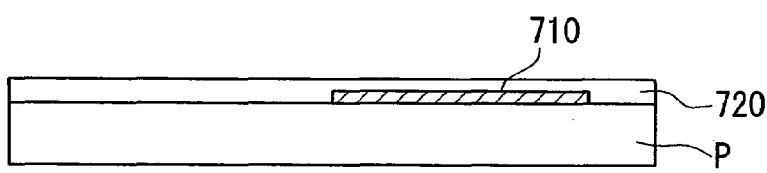
Figure 19C:
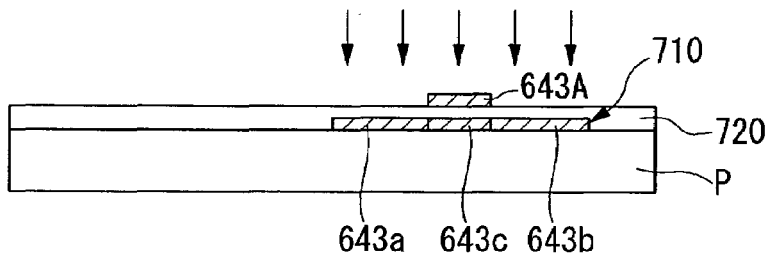
Figure 19D:
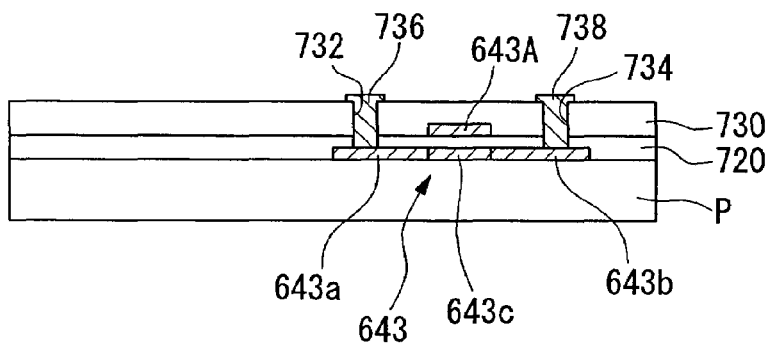
Figure 19E:
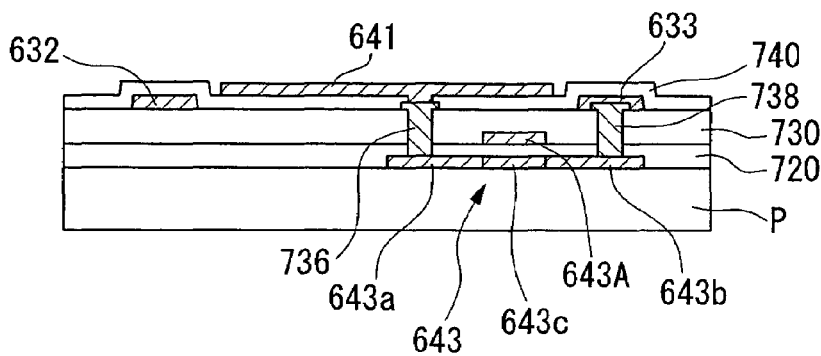

First, a substrate P is prepared. Here, with an organic EL element, it is possible to take out the light which is emitted by a light emitting layer which will be described hereinafter from the side of the substrate; and it is also possible to employ a structure where it is taken out from the opposite side to the substrate. If a structure is employed in which the emitted light is taken out from the substrate side, a transparent or semi transparent substance such as glass, quartz, resin or the like is used as the substrate material, but glass, which is cheap, is particularly suitable. In this example, as shown in FIG. 19A, a transparent substrate P which is made from glass or the like is used as the substrate. And a semiconductor film 700 which is made from an amorphous silicon layer is formed upon the substrate P. Next, a crystallization process such as laser annealing or a solid phase growth method or the like is performed upon this semiconductor film 700, and the semiconductor film 700 is crystallized into a polysilicon film. Next, as shown in FIG. 19B, the semiconductor film (the polysilicon film) 700 is patterned and a semiconductor film 710 is formed in the form of islets, and a gate insulation layer 720 is formed upon its surface. Next, as shown in FIG. 19C, a gate electrode 643A is formed. Next, in this state, it is irradiated with high density phosphorous ions, and source and drain regions 643a and 643b are formed upon the semiconductor film 710 so as each to match the gate electrodes 643A. It should be understood that the portions in which impurities have not been introduced become channel regions 643c. Next, as shown in FIG. 19D, after an inter-layer insulation layer which has contact holes 732 and 734 has been formed, relay electrodes 736 and 738 are embedded within these contact holes 732 and 734. Next, as shown in FIG. 19E, signal lines 632, a common electric power supply line 633, and scanning lines (not shown in FIGS. 19A through 19E) are formed over the inter-layer insulation layer 730. Here, the relay electrodes 738 and the various wires may be formed in the same process. At this time, the relay electrodes 736 come to be formed from an ITO film which will be described hereinafter. And an inter-layer insulation layer 740 is formed so as to cover over the upper surface of the various wires, contact holes (not shown in the figures) are formed in positions corresponding to the relay electrodes 736, an ITO film is formed so as to be embedded within these contact holes as well, furthermore this ITO film is patterned, and picture element electrodes 641 which are electrically connected to the source and drain regions 643a are formed in predetermined positions which are surrounded by the signal lines 632, the common electric power supply line 633, and the scanning lines (not shown in the figures). Here, the portions which are sandwiched by the signal lines 632, the common electric power supply line 633, and the scanning lines (not shown in the figures) come to be in positions in which a positive hole injection layer and/or a light emitting layer which will be described hereinafter are formed.

Figure 20A:
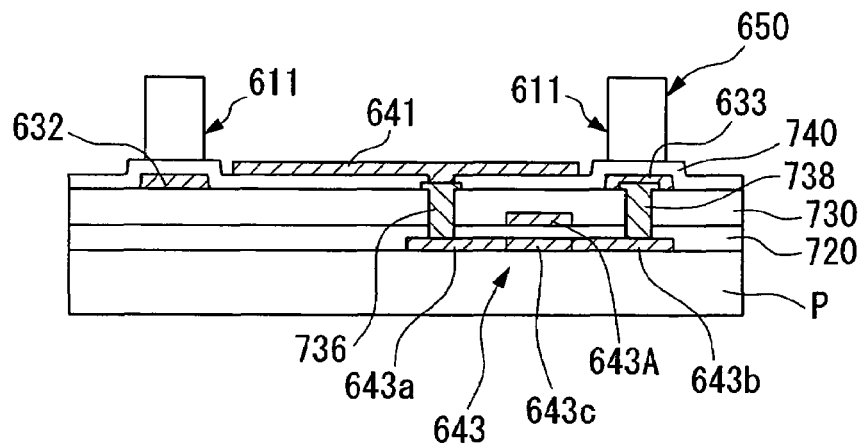
FIGS. 20A through 20C are typical views showing a process of manufacturing an organic EL device to which the method of manufacturing a device of the present invention is applied.
Figure 20B:
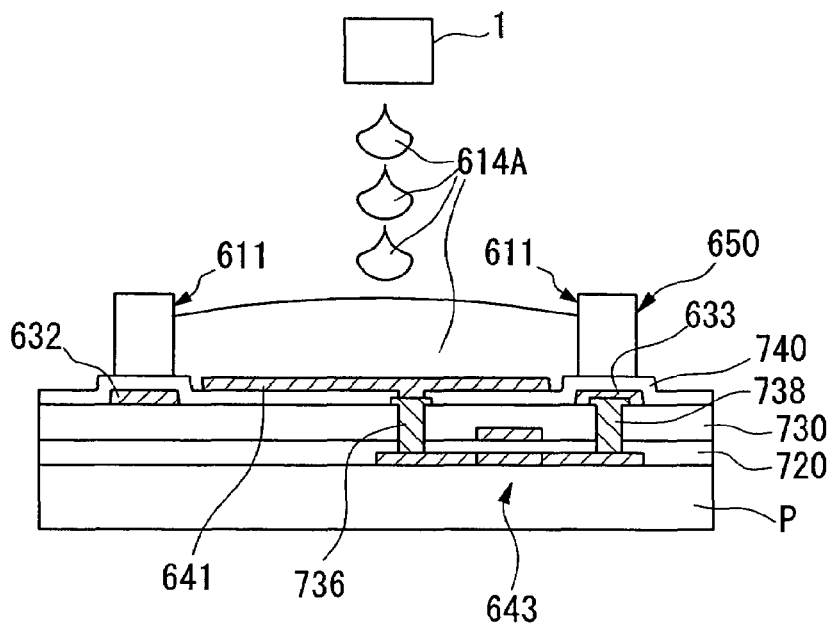
Figure 20C:
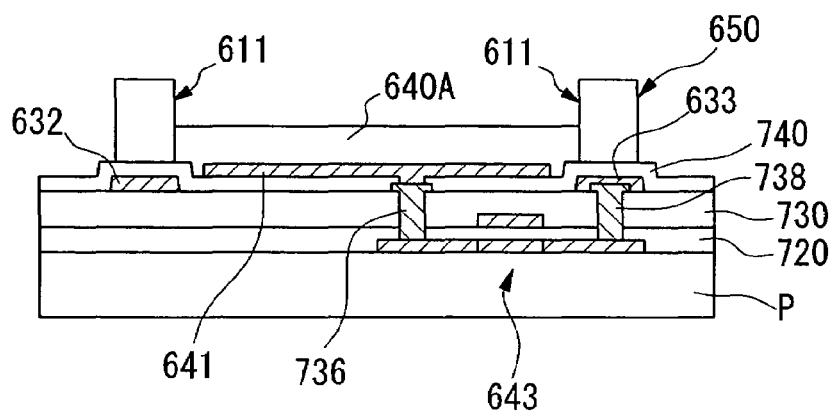

Next, as shown in FIG. 20A, banks 650 are formed so as to surround the formation spots. These banks 650 are ones which function as separate members, and it is desirable that they should be formed of an insulating organic material such as for example polyimide or the like. Furthermore, a material which exhibits non affinity with respect to the liquid state compound material which is discharged from the liquid drop discharge head is desirable for the banks 650. In order to realize non affinity for the banks 650, a method may be employed of so called surface processing the banks 650 with, for example, a fluorine type compound or the like. As such a fluorine type compound, for example, there are $CF_4$, $SF_5$, $CHF_3$ or the like, and as the surface processing, for example plasma processing, UV irradiation processing, and the like may be proposed. And, based upon this type of structure, steps 611 of sufficient height are formed between the positions of formation of the positive hole injection layer and the light emitting layer, in other words the positions of application of the materials from which these are formed, and the banks 650 around their peripheries. Next, as shown in FIG. 20B, in the state in which the upper surface of the substrate P is faced upwards, a liquid state compound material 614A which includes the material for formation of the positive hole injection layer is applied by a liquid drop discharge head selectively in application positions which are surrounded by the banks 650, in other words within the banks 650. And next, as shown in FIG. 20C, the solvent in the liquid state compound material 614A is evaporated by heating or irradiation with light, and thereby solid state positive hole injection layers 640A are formed over the picture element electrodes 641.

Figure 21A:
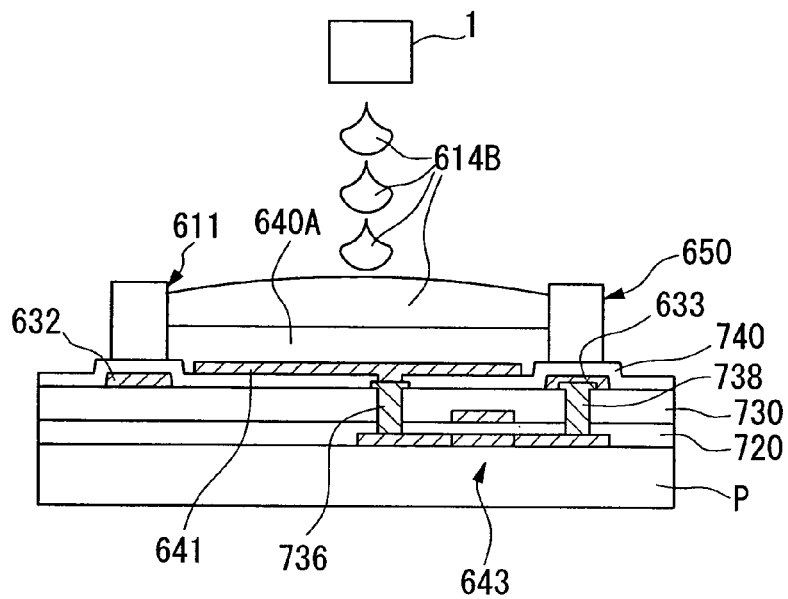
FIGS. 21A through 21C are typical views showing a process of manufacturing an organic EL device to which the method of manufacturing a device of the present invention is applied.
Figure 21B:
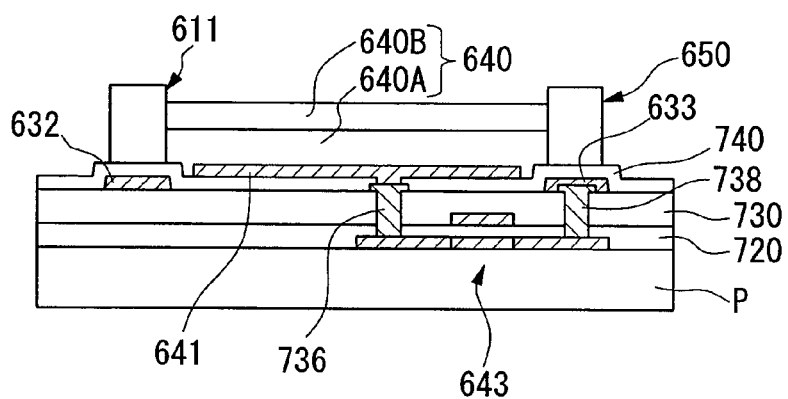
Figure 21C:
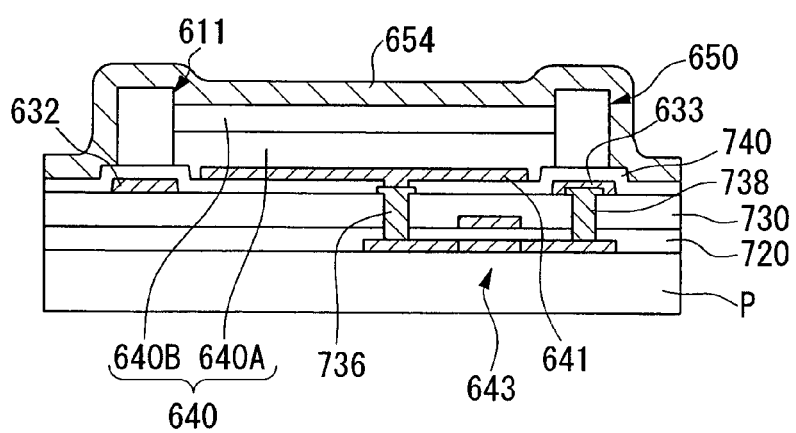

Next, as shown in FIG. 21A, in the state in which the upper surface of the substrate P is faced upwards, a liquid state compound material 614B which includes the material for formation of the light emitting layer (a light emitting material) is applied by a liquid drop discharge head selectively over the positive hole injection layers 640A within the banks 650. When the liquid state compound material 614B which includes the material for formation of the light emitting layer is discharged from the liquid drop discharge head, the liquid state compound material 614B is applied over the positive hole injection layers 640A within the banks 650. Here, the formation of the light emitting layers by discharge of the liquid state compound material 614B is performed by discharging and applying a liquid state compound material which includes a material for formation of a light emitting layer for emitting red colored light, a liquid state compound material which includes a material for formation of a light emitting layer for emitting green colored light, and a liquid state compound material which includes a material for formation of a light emitting layer for emitting blue colored light, upon the respectively corresponding picture elements. It should be understood that the picture elements which correspond to each of these colors are determined in advance so that they come to be arranged as specified. When by doing this the liquid state compound materials 614B containing the materials for formation of each light emitting layer of each color have been discharged and applied, solid state light emitting layers 640B are formed over the positive hole injection layers 640A as shown in FIG. 21B by evaporating the solvent in the liquid state compound materials 614B, and, by doing this, light emitting portions 640 are obtained which are made up from the positive hole injection layers 640A and the light emitting layers 640B. After this, as shown in FIG. 21C, a reflecting electrode 654 (an opposing electrode) is formed over the entire surface of the transparent substrate P, or in stripe form. By doing this, the organic EL element is manufactured.

It should be understood that it would also be acceptable to employ a structure in which the picture element electrodes were formed as electrodes endowed with a reflecting characteristic, and an electrode endowed with transparency (a transparent electrode) was formed as the opposing electrode. In this case, light would be generated and would be emitted in an upwards direction as seen in the figure. Furthermore, it would also be possible to form electrodes which were endowed with transparency as the picture element electrodes, and to form a material which was endowed with reflectivity in a layer lower than the picture element electrodes. In this case, for example, it would be possible to form them from a material having a material Such as aluminum (Al) or the like as its main constituent, and, in the same way as described previously, a structure would result in which light was emitted in an upwards direction as seen in the figures.

As has been described above, with this embodiment, the positive hole injection layers 640A and the light emitting layers 640B are formed based upon a liquid drop discharge method, and the method of manufacturing of the present invention is applied. Furthermore, the signal lines 632, the common electric power supply line 633, the scanning lines, and the picture element electrodes 641 and so on are formed based upon the method of manufacturing of the present invention.

What is claimed is:

1. A method of manufacturing a device, comprising:
 preparing a substrate;
 facing a liquid drop discharge head having a plurality of discharge nozzles arranged side by side with predetermined spacing distances in a first direction, which is horizontal relative to the substrate;
 setting a plurality of lattice-formed unit regions on which drops of liquid material are discharged from the discharge nozzles on the substrate;
 relatively shifting the liquid drop discharge head and the substrate in a second direction which is horizontal relative to the substrate and orthogonal relative to the first direction; and discharging the liquid material, on the substrate, from the discharge nozzles of the liquid drop discharge head, thereby forming a pattern on the substrate, wherein each of the unit regions is set so that, when each size of the spacing distances between each of the discharge nozzles of the liquid drop discharge head is defined as "a", each size of the unit regions in the first direction is defined as "by," and the number of lattice-formed unit regions is defined as "n" which is a positive integer, wherein the condition: by=a/n (where "n" is a positive integer) is satisfied.

2. A method of manufacturing a device according to claim 1, wherein each of the unit regions is set so that, when the size of the unit regions in the second direction is defined as "$b_{x1}$," and the number of lattice-formed unit regions is defined as "n" which is a positive integer, the condition:

$b_{x1}=a/n$ (where "$n$" is a positive integer)

is satisfied.

3. A method of manufacturing a device according to claim 1, wherein each of the unit regions is set so that, when each size of the unit regions in the second direction is termed "$b_{x1}$," and the number of lattice-formed unit regions is defined as "n" which is a positive integer, the condition:

$b_{x1}=b_y=a/n$ (where "$n$" is a positive integer)

is satisfied.

4. A method of manufacturing a device according to claim 1, wherein during the discharging of the liquid material while performing the relative shifting in the second direction, the liquid material is discharged in the second direction so that the liquid material disposed upon the substrate does not mutually overlap, or so that an overlap of less than or equal to 10% of the diameter of the liquid material is generated when disposed upon the substrate.

5. A method of manufacturing a device according to claim 1, wherein the discharging of the liquid material is performed during the relative shifting in the second direction, and the discharging of the liquid material is performed after the relative shifting of the liquid drop discharge head and the substrate by just a positive integer multiple of the size "$b_y$" in the first direction.

6. A method of manufacturing a device according to claim 5, wherein after the relative shifting in the first direction has been performed, during the discharging of the liquid material, the liquid material is discharged in the first direction so that the liquid material disposed upon the substrate does not mutually overlap, or so that an overlap of less than or equal to 10% of the liquid material is generated when disposed upon the substrate.

7. A method of manufacturing a device, comprising:

preparing a substrate;

facing a liquid drop discharge head having a plurality of discharge nozzles arranged side by side with predetermined spacing distances in a first direction, which is horizontal relative to the substrate;

setting a plurality of lattice-formed unit regions on which drops of liquid material are discharged from the discharge nozzles on the substrate;

relative shifting the liquid drop discharge head and the substrate in a second direction which is horizontal relative to the substrate and crossed relative to the first direction; and discharging the liquid material, on the substrate, from the discharge nozzles of the liquid drop discharge head, thereby forming a pattern on the substrate, wherein each of the unit regions is set so that, when a specified value in advance in a direction which is orthogonal relative to the second direction is defined as "bky", each size of the spacing distances between each of the discharge nozzles of the liquid drop discharge head is defined as "a", each size of the unit regions in the first direction is defined as "by2", each size of the unit regions in the second direction is defined as "bx2", and the relative shifting of the liquid drop discharge head slopes at an angle "θ" with respect to the first direction, the number of lattice-formed unit regions is defined as "n" which is a positive integer, and the number of lattice-formed unit regions is defined as "m" which is a positive integer, wherein the conditions:

$by2=bky/n$ (where "$n$" is a positive integer)

and $bx2=(a \cdot \sin \theta)/m$ (where "$m$" is a positive integer)

are satisfied.

* * * * *